(12) United States Patent
Yang et al.

(10) Patent No.: US 12,283,582 B2
(45) Date of Patent: Apr. 22, 2025

(54) PIXEL AND DISPLAY DEVICE INCLUDING THE SAME

(71) Applicant: Samsung Display Co., LTD., Yongin-si (KR)

(72) Inventors: Eun A Yang, Yongin-si (KR); Han Su Kim, Yongin-si (KR); Woong Bae Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 338 days.

(21) Appl. No.: 17/742,948

(22) Filed: May 12, 2022

(65) Prior Publication Data

US 2022/0406763 A1 Dec. 22, 2022

(30) Foreign Application Priority Data

Jun. 16, 2021 (KR) ........................ 10-2021-0077900

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/95* (2013.01); *H01L 27/124* (2013.01); *H01L 24/24* (2013.01);
(Continued)

(58) Field of Classification Search
CPC ..... H01L 25/167; H01L 24/95; H01L 27/124; H01L 24/24; H01L 24/25; H01L 33/507;
(Continued)

(56) References Cited

U.S. PATENT DOCUMENTS 8,872,214 B2 10/2014 Negishi et al.
9,112,112 B2 8/2015 Do et al.
(Continued)

FOREIGN PATENT DOCUMENTS

KR 10-0995574 11/2010
KR 10-1244926 3/2013
(Continued)

*Primary Examiner* — Joseph C. Nicely
*Assistant Examiner* — Alvin L Lee
(74) *Attorney, Agent, or Firm* — KILE PARK REED & HOUTTEMAN PLLC

(57) ABSTRACT

A display device according to an embodiment includes a pixel and a bank. The pixel includes sub-pixels and an emission area including sub-emission areas corresponding to the sub-pixels. The bank surrounds the emission area. The pixel includes electrodes disposed in each of the sub-emission areas, at least one light emitting element disposed in each of the sub-emission areas, and bank patterns disposed under the electrodes, the bank patterns overlapping a portion of the electrodes. The bank patterns include a first bank pattern including a first valley, the first bank pattern being disposed in a first edge area of the emission area in a first direction. The bank patterns include a second bank pattern including a second valley, the second bank pattern being disposed in a second edge area of the emission area in the first direction.

20 Claims, 12 Drawing Sheets

(51) Int. Cl.
*H01L 27/12* (2006.01)
*H01L 33/50* (2010.01)

(52) U.S. Cl.
CPC ............ *H01L 24/25* (2013.01); *H01L 33/507* (2013.01); *H01L 2224/24051* (2013.01); *H01L 2224/24145* (2013.01); *H01L 2224/25175* (2013.01); *H01L 2224/95102* (2013.01); *H01L 2224/95133* (2013.01); *H01L 2924/12041* (2013.01); *H01L 2933/0091* (2013.01)

(58) Field of Classification Search
CPC . H01L 2224/24051; H01L 2224/24145; H01L 2224/25175; H01L 2224/95102; H01L 2224/95133; H01L 2924/12041; H01L 2933/0091; H01L 27/1255; H01L 33/08; H01L 33/18; H01L 33/0095; H01L 25/0753; H01L 27/156; H01L 33/04; H01L 33/483; H01L 33/50
See application file for complete search history.

(56) References Cited

U.S. PATENT DOCUMENTS

| | | | |
|---|---|---|---|
| 9,601,717 | B2 | 3/2017 | Lee et al. |
| 9,773,761 | B2 | 9/2017 | Do |
| 11,004,892 | B2 | 5/2021 | Kim et al. |
| 2011/0089850 | A1 | 4/2011 | Shibata et al. |
| 2018/0138157 | A1* | 5/2018 | Im ................... H01L 25/0753 |
| 2020/0013766 | A1* | 1/2020 | Kim .................... H01L 25/167 |
| 2021/0013297 | A1* | 1/2021 | Okabe ................ H05B 33/06 |
| 2021/0375194 | A1* | 12/2021 | Kwag ............... H01L 25/0753 |

FOREIGN PATENT DOCUMENTS

| | | | |
|---|---|---|---|
| KR | 10-1490758 | 2/2015 | |
| KR | 10-2017-0138388 | 12/2017 | |
| KR | 10-2020-0016424 | 2/2020 | |
| KR | 10-2020-0088946 | 7/2020 | |
| KR | 10-2020-0134359 | 12/2020 | |
| WO | WO-2020075937 A1 * | 4/2020 | ............... G09G 3/32 |

* cited by examiner

PIXEL AND DISPLAY DEVICE INCLUDING THE SAME

CROSS-REFERENCE TO RELATED APPLICATION(S)

This application claims priority to and benefits of Korean Patent Application No. 10-2021-0077900, filed Jun. 16, 2021, in the Korean Intellectual Property Office, the entire contents of which are incorporated herein by reference.

BACKGROUND

1. Field

Embodiments relate to a pixel and a display device including the same.

2. Description of the Related Art

In recent years, interest in information displays has increased. Accordingly, research and development on display devices has continued.

SUMMARY

A technical problem to be solved by the embodiments is to provide a pixel capable of improving manufacturing efficiency and a display device including the same.

Technical problems addressed by the embodiments are not limited to the technical problem described above. Other technical problems that are not mentioned will be clearly understood by those skilled in the art from the following description.

A display device according to an embodiment may include a pixel and a bank. The pixel may include sub-pixels and an emission area including sub-emission areas corresponding to the sub-pixels, and the bank may surround the emission area. The pixel may include electrodes disposed in each of the sub-emission areas, at least one light emitting element disposed in each of the sub-emission areas, and bank patterns disposed under the electrodes. The bank patterns may overlap a portion of the electrodes. The bank patterns may include a first bank pattern including a first valley, the first bank pattern being disposed in a first edge area of the emission area in a first direction, and a second bank pattern including a second valley, the second bank pattern being disposed in a second edge area of the emission area in the first direction.

In an embodiment, the first valley and the second valley may each have a slit shape that extends in a second direction intersecting the first direction.

In an embodiment, the bank may include a first opening corresponding to the emission area of the pixel, and a third valley surrounding the first opening.

In an embodiment, the pixel may include a separation area spaced apart from the emission area. An end of at least one of the electrodes may be disposed in the separation area. The bank may further include a second opening corresponding to the separation area.

In an embodiment, the third valley may surround the first opening and the second opening.

In an embodiment, the third valley may have a closed shape in a plan view.

In an embodiment, each of the sub-pixels may include a pixel circuit and a light emitting unit. The pixel circuit may include a circuit element electrically connected to at least one of the electrodes. The light emitting unit may include the electrodes and the at least one light emitting element.

In an embodiment, the display device may further include a circuit element layer and a display element layer. The circuit element layer may include lines electrically connected to the pixel circuit and the light emitting unit. The display element layer may overlap the circuit element layer and may include the light emitting unit.

In an embodiment, the lines of the circuit element layer may be disposed around the emission area and may not overlap the emission area.

In an embodiment, the bank may overlap the lines of the circuit element layer.

In an embodiment, the pixel may further include a light conversion layer disposed in at least one of the sub-emission areas and overlapping the at least one light emitting element. The light conversion layer may include at least one of wavelength conversion particles and light scattering particles.

In an embodiment, the at least one light emitting element may include at least one color light emitting element electrically connected to the electrodes. The light conversion layer disposed in at least one of the sub-emission areas may include quantum dots that convert a first color light emitted from the at least one color light emitting element into a second color light.

A pixel according to an embodiment may include an emission area including a plurality of sub-emission areas, electrodes disposed in each of the sub-emission areas, at least one light emitting element disposed in each of the sub-emission areas, bank patterns disposed under the electrodes, the bank patterns overlapping a portion of the electrodes, and a bank including a first opening corresponding to the emission area, the bank surrounding the emission area. The bank patterns may include a first bank pattern including a first valley, the first bank pattern being disposed in a first edge area of the emission area in a first direction, and a second bank pattern including a second valley, the second bank pattern being disposed in a second edge area of the emission area in the first direction.

In an embodiment, the first valley and the second valley may each have a slit shape that extends in a second direction intersecting the first direction.

In an embodiment, the bank may include a third valley that surrounds the first opening.

In an embodiment, the pixel may further include a separation area spaced apart from the emission area. An end of at least one of the electrodes may be disposed in the separation area. The bank may further include a second opening corresponding to the separation area.

In an embodiment, the third valley may surround the first opening and the second opening.

In an embodiment, the third valley may have a closed shape in a plan view.

In an embodiment, the pixel may further include a light conversion layer disposed in each of the sub-emission areas and overlapping the at least one light emitting element. The light conversion layer may include at least one of wavelength conversion particles and light scattering particles.

In an embodiment, the at least one light emitting element may include at least one color light emitting element electrically connected to the electrodes. The light conversion layer disposed in at least one of the sub-emission areas may include quantum dots that convert a first color light emitted from the at least one color light emitting element into light of a second color light.

Details of other embodiments are included in the detailed description and drawings.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
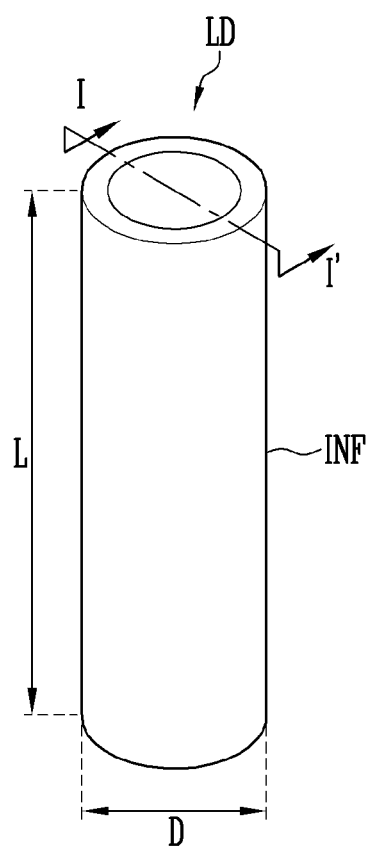
FIG. 1 is a schematic perspective view illustrating a light emitting element according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the following description, the singular forms also include the plural forms unless the context clearly includes only the singular.

In the drawings, sizes, thicknesses, ratios, and dimensions of the elements may be exaggerated for ease of description and for clarity. Like numbers refer to like elements throughout.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
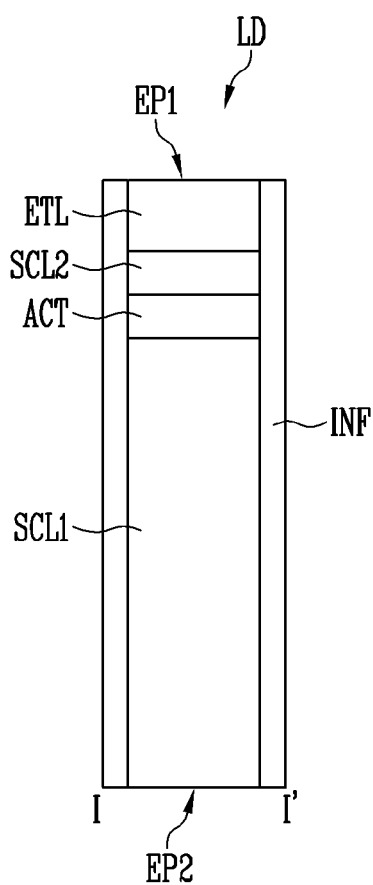
FIG. 2 is a schematic cross-sectional view illustrating the light emitting element according to an embodiment.

FIG. 1 is a schematic perspective view illustrating a light emitting element LD according to an embodiment. FIG. 2 is a schematic cross-sectional view illustrating the light emitting element LD according to an embodiment. For example, FIG. 1 shows an example of the light emitting element LD that can be used as a light source of a display device according to an embodiment, and FIG. 2 shows an example of a cross section of the light emitting element LD taken along line I-I' of FIG. 1.

Referring to FIGS. 1 and 2, the light emitting element LD may include a first semiconductor layer SCL1, an active layer ACT, and a second semiconductor layer SCL2 sequentially arranged, for example, in a longitudinal direction. The light emitting element LD may further include an insulating thin film INF surrounding the outer peripheral surface (for example, a side surface) of the first semiconductor layer SCL1, the active layer ACT, and the second semiconductor layer SCL2. Also, the light emitting element LD may optionally further include an electrode layer ETL disposed on the second semiconductor layer SCL2. The insulating thin film INF may or may not cover at least a portion of the outer peripheral surface of the electrode layer ETL. Also, according to an embodiment, the light emitting element LD may further include another electrode layer disposed on a surface (for example, a lower surface) of the first semiconductor layer SCL1.

In an embodiment, the light emitting element LD may have the shape of a rod (or bar) extending in one direction and may have a first end EP1 and a second end EP2 at each of the ends in the longitudinal direction (or thickness direction). The first end EP1 may include a first bottom surface (or upper surface) of the light emitting element LD and/or a peripheral area thereof, and the second end EP2 may include a second bottom surface (or lower surface) of the light emitting element LD and/or a peripheral area thereof. For example, the electrode layer ETL and/or the second semiconductor layer SCL2 may be disposed at the first end EP1 of the light emitting element LD, and the first semiconductor layer SCL1 and/or at least one electrode layer connected to the first semiconductor layer SCL1 may be disposed at the second end EP2 of the light emitting element LD.

In describing embodiments, a bar shape may include a rod-like shape or a bar-like shape having an aspect ratio greater than 1, such as a circular column or a polygonal column, and the shape of the cross-section is not particularly limited. For example, a length L of the light emitting element LD may be greater than a diameter D (or a width of a cross-section) thereof.

The first semiconductor layer SCL1, the active layer ACT, the second semiconductor layer SCL2, and the electrode layer ETL may be sequentially disposed in a direction from the second end EP2 to the first end EP1 of the light emitting element LD. For example, the first semiconductor layer SCL1 may be disposed at the second end EP2 of the light emitting element LD, and the electrode layer ETL may be disposed at the first end EP1 of the light emitting element LD. Alternatively, at least one other electrode layer may be disposed at the second end EP2 of the light emitting element LD.

The first semiconductor layer SCL1 may be a semiconductor layer of a first conductivity type. For example, the first semiconductor layer SCL1 may be an N-type semiconductor layer including an N-type dopant. For example, the first semiconductor layer SCL1 may include any semiconductor material of InAlGaN, GaN, AlGaN, InGaN, AlN, and InN, and may be the N-type semiconductor layer doped with a dopant such as Si, Ge, Sn, or the like. However, the material constituting the first semiconductor layer SCL1 is not limited thereto, and various other materials may be used to form the first semiconductor layer SCL1.

The active layer ACT may be disposed on the first semiconductor layer SCL1 and may be formed in a single-quantum well or multi-quantum well structure. The position of the active layer ACT may be varied according to the type of the light emitting element LD. In an embodiment, the active layer ACT may emit light having a wavelength of about 400 nm to about 900 nm and may use a double hetero-structure.

A clad layer (not shown) doped with a conductive dopant may be selectively formed on the upper and/or lower portions of the active layer ACT. For example, the clad layer may be formed of an AlGaN layer or an InAlGaN layer. According to an embodiment, a material such as AlGaN or AlInGaN may be used to form the active layer ACT, and various other materials may be used to form the active layer ACT.

In case that a voltage equal to or greater than a threshold voltage is applied to both ends of the light emitting element LD, the light emitting element LD may emit light while electron-hole pairs are combined in the active layer ACT. By controlling the light emitted by the light emitting element LD using this principle, the light emitting element LD may be used as a light source for various light emitting devices including pixels of a display device.

The second semiconductor layer SCL2 may be disposed on the active layer ACT and may be a semiconductor layer of a second conductivity type different from that of the first semiconductor layer SCL1. For example, the second semiconductor layer SCL2 may include a P-type semiconductor layer including a P-type dopant. For example, the second semiconductor layer SCL2 may include at least one semiconductor material of InAlGaN, GaN, AlGaN, InGaN, AlN, and InN, and may be a P-type semiconductor layer doped with a dopant such as Mg or the like. However, the material constituting the second semiconductor layer SCL2 is not limited thereto, and various other materials may be used to form the second semiconductor layer SCL2.

In an embodiment, the first semiconductor layer SCL1 and the second semiconductor layer SCL2 may have different lengths (or thicknesses) in the longitudinal direction of the light emitting element LD. For example, the first semiconductor layer SCL1 may have a longer length (or a thicker thickness) than the second semiconductor layer SCL2 in the longitudinal direction of the light emitting element LD. Accordingly, the active layer ACT may be positioned closer to the first end EP1 than to the second end EP2.

The electrode layer ETL may be disposed on the second semiconductor layer SCL2. The electrode layer ETL may protect the second semiconductor layer SCL2 and may be an electrode for smoothly connecting the second semiconductor layer SCL2 to an electrode or a line. For example, the electrode layer ETL may be an ohmic contact electrode or a Schottky contact electrode.

In describing embodiments, the term "connected (or coupled)" may refer generically to a physical and/or electrical connection (or coupling). Also, it may refer generically to direct or indirect connection (or coupling) and integral or non-integral connection (or coupling).

The electrode layer ETL may be substantially transparent or translucent. Accordingly, light generated from the light emitting element LD may pass through the electrode layer ETL and be emitted to outside of the light emitting element LD. In other embodiments, when the light generated from the light emitting element LD is emitted to the outside of the light emitting element LD without passing through the electrode layer ETL, the electrode layer ETL may be formed to be opaque.

In an embodiment, the electrode layer ETL may include a metal or a metal oxide. For example, the electrode layer ETL may include a metal such as chromium (Cr), titanium (Ti), aluminum (Al), gold (Au), nickel (Ni), and copper (Cu), or an oxide or alloy thereof. The electrode layer ETL may include a transparent conductive material such as ITO (Indium Tin Oxide), IZO (Indium Zinc Oxide), ITZO (Indium Tin Zinc Oxide), ZnO (Zinc Oxide), and $In_2O_3$ (Indium Oxide), or a mixture thereof.

The insulating thin film INF may expose the electrode layer ETL (or the second semiconductor layer SCL2) and the first semiconductor layer SCL1 (or another electrode layer provided on the second end EP2 of the light emitting element LD) at the first and second ends EP1 and EP2 of the light emitting element LD, respectively. For example, the insulating thin film INF may not be provided on two bottom surfaces corresponding to the first and second ends EP1 and EP2 of the light emitting element LD.

In case that the insulating thin film INF covers the surface of the light emitting element LD, for example, covers the outer peripheral surface of the first semiconductor layer SCL1, the active layer ACT, the second semiconductor layer SCL2 and/or the electrode layer ETL, short circuit defects through the light emitting element LD can be prevented. Accordingly, electrical stability of the light emitting element LD can be improved. When the insulating thin film INF is provided on the surface of the light emitting element LD, surface defects of the light emitting element LD can be minimized, so that lifespan and efficiency can be improved.

In an embodiment, the light emitting element LD may be manufactured through a surface treatment process. For example, by treating the surface of light emitting elements LD using a hydrophobic material, when light emitting elements LD are mixed in a fluid solution (hereinafter, referred to as light emitting element ink or light emitting element mixture) and supplied to each emission area, the light emitting elements LD may be uniformly dispersed in the light emitting element ink without being non-uniformly aggregated.

The insulating thin film INF may include a transparent insulating material. Accordingly, light generated in the active layer ACT may pass through the insulating thin film INF to be emitted to the outside of the light emitting element LD. For example, the insulating thin film INF may include at least one insulating material of $SiO_2$, or another silicon oxide ($SiO_x$), $Si_3N_4$, or another silicon nitride ($SiN_x$), $Al_2O_3$, or another aluminum oxide ($Al_xO_y$), $TiO_2$, or another titanium oxide ($Ti_xO_y$), and hafnium oxide ($HfO_x$), but the embodiments are not limited thereto.

The insulating thin film INF may be formed of a single layer or multiple layers. For example, the insulating thin film INF may be formed of a double film.

In an embodiment, the insulating thin film INF may be partially etched (or removed) in an area corresponding to at least one of the first end EP1 and the second end EP2 of the light emitting element LD. For example, the insulating thin film INF may be etched to have a rounded shape in the at least one area, but the shape of the insulating thin film INF is not limited thereto.

In an embodiment, the light emitting element LD may have a small size in a range of nanometers to micrometers. For example, the light emitting element LD may have the diameter D (or the width of the cross-section) and/or the length L in a range of nanometers to micrometers. For example, the light emitting element LD may have a diameter D and/or a length L in the range of several tens of nanometers to several tens of micrometers. However, the size of the light emitting element LD may vary.

The structure, shape, size, and/or type of the light emitting element LD may be changed according to embodiments. For example, the light emitting element LD may be formed in another structure and/or shape, such as a core-shell structure.

A light emitting device including the light emitting element LD may be used in various types of devices requiring a light source. For example, multiple light emitting elements LD may be arranged in a pixel (or sub-pixel) of a display device, and the light emitting elements LD may be used as a light source of the pixel. The light emitting element LD may also be used in other types of devices that require a light source, such as a lighting device.

Figure 3:
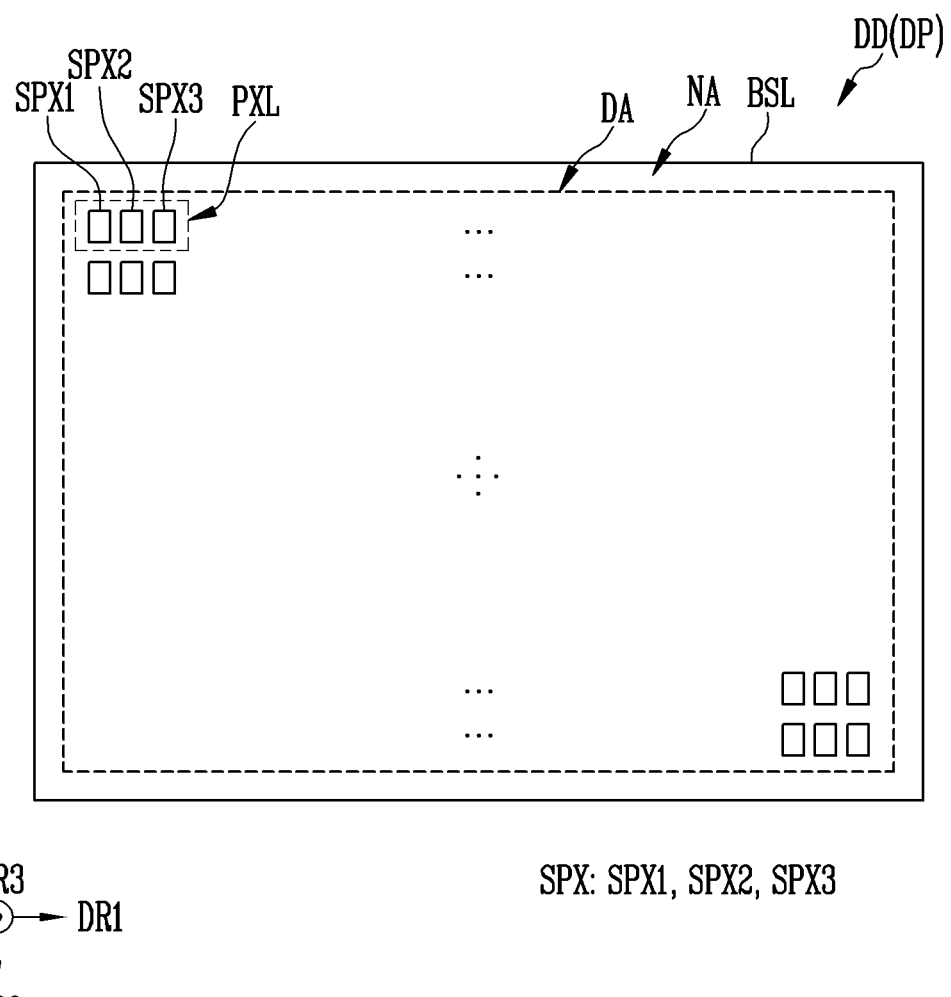
FIG. 3 is a schematic plan view illustrating a display device according to an embodiment.

FIG. 3 is a schematic plan view illustrating a display device DD according to an embodiment. FIG. 3 schematically shows a structure of the display device DD centered on a display panel DP including a display area DA. The display device DD may further include a driving circuit (for example, a scan driver, a data driver, and a timing controller) for driving pixels PXL. At least a portion of the driving circuit may be formed and/or disposed inside the display panel DP, or the driving circuit may be provided outside the display panel DP.

Referring to FIG. 3, the display device DD may include a base layer BSL and the pixels PXL disposed on the base layer BSL.

The base layer BSL may be a base member constituting the display device DD, and may constitute, for example, a base surface of the display panel DP. The base layer BSL may include the display area DA for displaying an image and a non-display area NA excluding the display area DA. The display area DA may constitute a screen on which the image is displayed, and the non-display area NA may be an area other than the display area DA.

The display panel DP may have various shapes. For example, the display panel DP have a rectangular plate shape but is not limited thereto. For example, the display panel DP may have a shape such as a circle or an oval. Also, the display panel DP may include angled corners and/or curved corners.

For convenience, in FIG. 3, the display panel DP is shown as having the rectangular plate shape. Also, in the display panel DP, a horizontal direction (for example, a row direction or an X direction) is indicated as a first direction DR1, a vertical direction (for example, a column direction or a Y direction) is indicated as a second direction DR2, and a thickness direction (or a height direction) is indicated as a third direction DR3.

The display area DA may have various shapes. For example, the display area DA may have various shapes such as a rectangle, a circle, an oval, or the like. In an embodiment, the display area DA may have a shape corresponding to the shape of the display panel DP, but the embodiments are not limited thereto.

The pixels PXL may be arranged in the display area DA. For example, the display area DA may include pixel areas in which each pixel PXL is disposed.

Each pixel PXL may include sub-pixels SPX. For example, the pixel PXL may include a first sub-pixel SPX1, a second sub-pixel SPX2, and a third sub-pixel SPX3.

The first, second, and third sub-pixels SPX1, SPX2, and SPX3 may emit light of different colors. For example, the first, second, and third sub-pixels SPX1, SPX2, and SPX3 may each emit blue, green, and red light, respectively. The number, type, and/or arrangement structure of the sub-pixels SPX constituting the pixel PXL may vary according to embodiments.

Each sub-pixel SPX may include at least one light source. In an embodiment, the light source may include the light emitting element LD according to the embodiment of FIGS. 1 and 2, for example, the rod-like shape light emitting element LD having a small size in a range of nanometers to micrometers. Various types of light emitting elements may be used as the light source of the sub-pixel SPX. For example, in another embodiment, the light source of the sub-pixel SPX may use an inorganic or organic light emitting element having a different size range, or an inorganic light emitting element having the core-shell structure.

In an embodiment, the sub-pixels SPX in each pixel PXL may include light emitting elements emitting the same color light (a first color light). A light conversion layer including at least one type of wavelength conversion particles (for example, particles that convert the color and/or wavelength of light, such as quantum dots) for converting light of the first color into a second color or a third color may be provided in an emission area (hereinafter, referred to as a sub-emission area) of at least one of the sub-pixels SPX. For example, each of the first, second, and third sub-pixels SPX1, SPX2, and SPX3 may include at least one blue light emitting element emitting blue light. A light conversion layer including green quantum dots and a light conversion layer including red quantum dots may be respectively disposed in second and third sub-emission areas corresponding to the second and third sub-pixels SPX2 and SPX3. Accordingly, the first, second, and third sub-pixels SPX1, SPX2, and SPX3 may emit blue, green, and red light, respectively.

The pixels PXL may have a structure according to the embodiments described below. For example, the pixels PXL may have a structure applying one of the embodiments described below, or a structure combining two or more of the embodiments.

The non-display area NA may be disposed around the display area DA. Lines, a built-in circuit unit, and/or pads connected to the pixels PXL of the display area DA may be disposed in the non-display area NA.

In an embodiment, the non-display area NA may have a narrow width. Accordingly, the display device DD may be implemented as a bezel-less display device. In an embodiment, in order to reduce the non-display area NA, the display panel DP may substantially not include a fan-in area and/or a fan-out area. Accordingly, all lines necessary for supplying power and signals to the pixels PXL may be disposed inside the display area DA (for example, between the sub-pixels SPX and/or the pixels PXL). The lines may be uniformly distributed and/or arranged in the display area DA in order to ensure uniform visibility in the entire display area DA.

The display device DD in which the non-display area NA is reduced and/or removed may provide a larger screen compared to the overall size (for example, area). Also, multiple display devices DD with reduced non-display areas NA may be used to construct a tiling display device. For example, when the tiling display device is configured by arranging the plurality of display devices DD in the first direction DR1 and/or the second direction DR2, the distance between display areas DA of adjacent display devices DD may decrease as the non-display area NA of each of the display devices DD is reduced and/or removed. Accordingly, the boundary between the display devices DD may not be visible or minimized, and a seamless tiling display device may be implemented.

Figure 4:
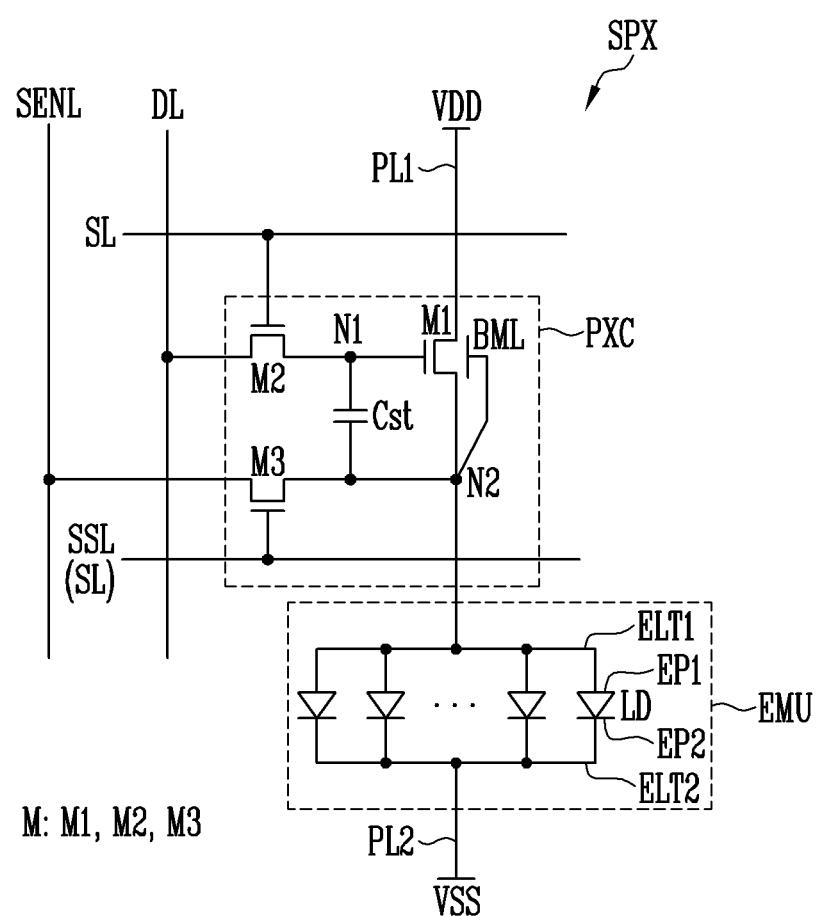
FIGS. 4 and 5 are schematic diagrams of equivalent circuits illustrating sub-pixels according to embodiments.
Figure 5:
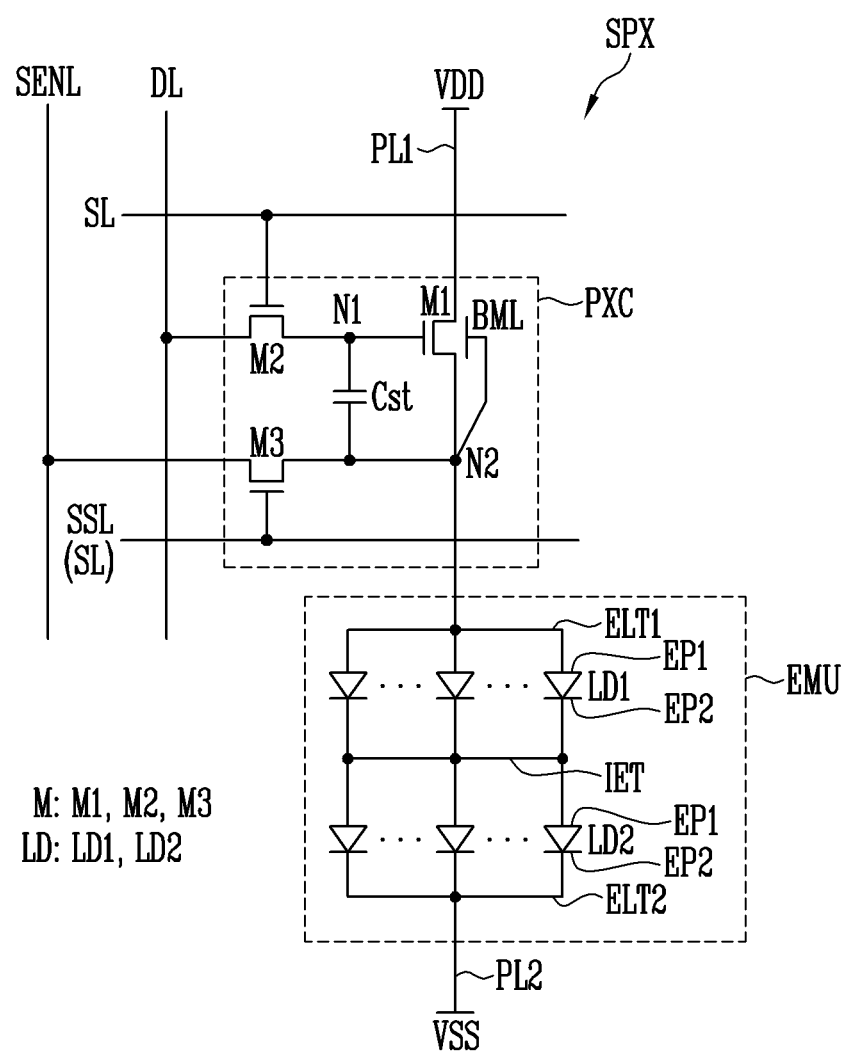

FIGS. 4 and 5 are schematic diagrams of equivalent circuits illustrating sub-pixels SPX according to the embodiments. For example, FIGS. 4 and 5 show sub-pixels SPX including light emitting units EMU having different structures.

According to an embodiment, each sub-pixel SPX shown in FIGS. 4 and 5 may be any one of the sub-pixels SPX included in each pixel PXL of FIG. 3. Also, the sub-pixels SPX disposed in the display area DA may have substantially the same or similar structure to each other.

Referring to FIGS. 4 and 5, the sub-pixel SPX may be connected to a scan line SL, a data line DL (or any one of sub-data lines), a first power source line PL1, and a second power source line PL2. Also, the sub-pixel SPX may be selectively connected to at least one other power source line and/or signal line. For example, the sub-pixel SPX may be further connected to a sensing line SENL and/or a control line SSL.

The sub-pixel SPX may include a light emitting unit EMU for generating light having a luminance corresponding to each data signal. Also, the sub-pixel SPX may further include a pixel circuit PXC for driving the light emitting unit EMU.

The pixel circuit PXC may be connected to the scan line SL and the data line DL. Also, the pixel circuit PXC may be connected between the first power source line PL1 and the light emitting unit EMU. For example, the pixel circuit PXC may be connected to the scan line SL to which a first scan signal is supplied, the data line DL to which a data signal is supplied, the first power source line PL1 to which a first power source VDD is supplied, and a first pixel electrode ELT1 of the light emitting unit EMU.

The pixel circuit PXC may be selectively connected to the control line SSL to which a second scan signal is supplied, and the sensing line SENL connected to a reference power source (or an initialization power source) or a sensing circuit in correspondence with a display period or a sensing period. In an embodiment, the second scan signal and the first scan signal may be the same as or different from each other. When the second scan signal and the first scan signal are the same, the control line SSL may be integrated with the scan line SL.

The pixel circuit PXC may include at least one transistor M and a capacitor Cst. For example, the pixel circuit PXC may include a first transistor, a second transistor M2, a third transistor M3, and the capacitor Cst.

The first transistor may be connected between the first power source line PL1 and a second node N2. The second node N2 may be a node to which the pixel circuit PXC and the light emitting unit EMU are connected. For example, the second node N2 may be a node to which one electrode (for example, a source electrode) of the first transistor and the first pixel electrode ELT1 (for example, an anode electrode) of the light emitting unit EMU are connected. A gate electrode of the first transistor may be connected to a first node N1. The first transistor may control driving current supplied to the light emitting unit EMU in response to a voltage of the first node N1. For example, the first transistor may be a driving transistor of the sub-pixel SPX.

In an embodiment, the first transistor may further include a bottom metal layer BML (also referred to as a back gate electrode or a second gate electrode). In an embodiment, the bottom metal layer BML may be connected to an electrode (for example, the source electrode) of the first transistor.

In an embodiment in which the first transistor includes the bottom metal layer BML, a back-biasing technique (or a sync technique) in which a threshold voltage of the first transistor is shifted in a negative direction or a positive direction by applying a back-biasing voltage to the bottom metal layer BML of the first transistor may be applied. When the bottom metal layer BML is disposed under a semiconductor pattern constituting a channel of the first transistor, light incident on the semiconductor pattern is blocked, so that operating characteristic of the first transistor may be stabilized.

The second transistor M2 may be connected between the data line DL and the first node N1. A gate electrode of the second transistor M2 may be connected to the scan line SL. The second transistor M2 may be turned on when the first scan signal of a gate-on voltage (for example, a logic high voltage or a high level voltage) is supplied from the scan line SL to connect the data line DL and the first node N1.

The data signal of a corresponding frame may be supplied to the data line DL for each frame period, and the data signal may be transferred to the first node N1 through the second transistor M2 during a period in which the first scan signal of the gate-on voltage is supplied. For example, the second transistor M2 may be a switching transistor for transferring each data signal to the inside of the sub-pixel SPX.

A first electrode of the capacitor Cst may be connected to the first node N1, and a second electrode of the capacitor Cst may be connected to the second node N2. The capacitor Cst may charge a voltage corresponding to the data signal supplied to the first node N1 during each frame period.

The third transistor M3 may be connected between the second node N2 and the sensing line SENL. A gate electrode of the third transistor M3 may be connected to the control line SSL (or the scan line SL). The third transistor M3 may be turned on when the second scan signal (or the first scan signal) of the gate-on voltage (for example, the logic high voltage or the high level voltage) is supplied from the control line SSL to transfer a reference voltage (or an initialization voltage) supplied to the sensing line SENL to the second node N2 or a voltage of the second node N2 to the sensing line SENL. The voltage of the second node N2 may be transferred to the sensing circuit through the sensing line SENL, and may be provided to the driving circuit (for example, the timing controller) and used to compensate for deviation in characteristics of the pixels PXL (or sub-pixels SPX).

Although all of transistors M included in the pixel circuit PXC are shown as N-type transistors in FIGS. 4 and 5, the embodiments are not limited thereto. For example, at least one of the first, second, and third transistors M1, M2, and M3 may be changed to a P-type transistor. The structure and driving method of the sub-pixel SPX may vary according to embodiments. The light emitting unit EMU may be connected between the first power source VDD and a second power source VSS, and may include the first pixel electrode ELT1, a second pixel electrode ELT2, and at least one light emitting element LD. For example, the light emitting unit EMU may include the first pixel electrode ELT1 connected to the first power source VDD through the pixel circuit PXC and/or the first power source line PL1, the second pixel electrode ELT2 connected to the second power source VSS through the second power source line PL2, and at least one light emitting element LD connected between the first pixel electrode ELT1 and the second pixel electrode ELT2.

The first power source VDD and the second power source VSS may have different potentials. For example, the first power source VDD may be a high potential pixel power source, and the second power source VSS may be a low potential pixel power source. A potential difference between the first power source VDD and the second power source VSS may be equal to or greater than a threshold voltage of the light emitting elements LD.

In an embodiment, the light emitting unit EMU may include light emitting elements LD connected in parallel in a forward direction between the first pixel electrode ELT1 and the second pixel electrode ELT2 as in the embodiment of FIG. 4. For example, first ends EP1 of the light emitting elements LD may be connected to the first pixel electrode ELT1, and second ends EP2 of the light emitting elements LD may be connected to the second pixel electrode ELT2. In another embodiment, the light emitting unit EMU may include light emitting elements LD connected only in series between the first pixel electrode ELT1 and the second pixel electrode ELT2 or include only a single light emitting element LD connected in a forward direction between the first pixel electrode ELT1 and the second pixel electrode ELT2. In an embodiment, the light emitting unit EMU may include light emitting elements LD connected in series and in parallel between the first pixel electrode ELT1 and the second pixel electrode ELT2 as in the embodiment of FIG. 5. When the light emitting unit EMU includes light emitting elements LD arranged in at least two series stages, the light emitting unit EMU may include at least one intermediate electrode IET (also referred to as a third pixel electrode) connected between the first pixel electrode ELT1 and the second pixel electrode IET. For example, the light emitting unit EMU may include the first pixel electrode ELT1, the intermediate electrode IET, and the second pixel electrode ELT2 sequentially connected between the pixel circuit PXC and the second power source line PL2. The light emitting unit EMU may include light emitting elements LD including at least one first light emitting element LD1 (for example, multiple first light emitting elements LD1) connected in a forward direction between the first pixel electrode ELT1 and the intermediate electrode IET, and at least one second light emitting element LD2 (for example, multiple second light emitting elements LD2) connected in a forward direction between the intermediate electrode IET and the second pixel electrode ELT2. For example, first ends EP1 and second ends EP2 of the first light emitting elements LD1 may be connected to the first pixel electrode ELT1 and the intermediate electrode IET, respectively, and first ends EP1 and second ends EP2 of the second light emitting elements LD2 may be connected to the intermediate electrode IET and the second pixel electrode ELT2, respectively.

Each light emitting element LD may constitute each effective light source. These effective light sources may be gathered to constitute a light source of the sub-pixel SPX.

The light emitting elements LD may emit light with a luminance corresponding to the driving current supplied through the pixel circuit PXC. During each frame period, the pixel circuit PXC may supply the driving current corresponding to the data signal to the light emitting unit EMU. The driving current supplied to the light emitting unit EMU may be divided and flow through the light emitting elements LD. Accordingly, each light emitting element LD emits light with a luminance corresponding to a current flowing through the light emitting element LD, and the light emitting unit EMU may emit light with a luminance corresponding to the driving current. Only the light emitting elements LD (effective light sources) connected in the forward direction between the first pixel electrode ELT1 and the second pixel electrode ELT2 are shown in FIGS. 4 and 5, but the embodiments are not limited thereto. For example, the light emitting unit EMU may further include at least one ineffective light source in addition to the light emitting elements LD constituting each effective light source. For example, the light emitting unit EMU may further include at least one ineffective light emitting element arranged in a reverse direction or having at least one end floated between the first pixel electrode ELT1 and the second pixel electrode ELT2.

Figure 6:
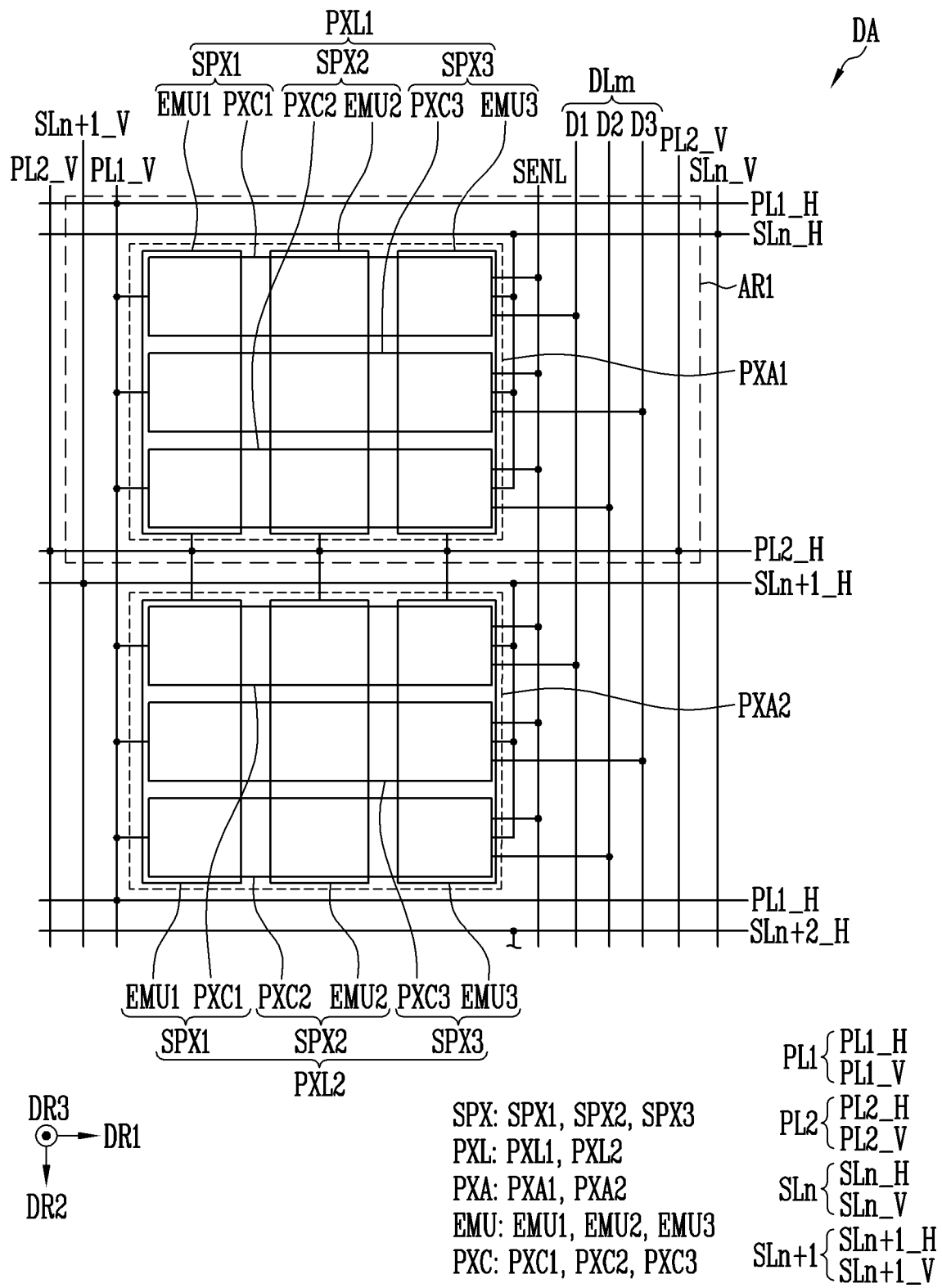
FIG. 6 is a schematic plan view illustrating a display area according to an embodiment.

FIG. 6 is a schematic plan view illustrating a display area DA according to an embodiment. FIG. 6 schematically shows a structure of the display area DA including a first pixel PXL1 and a second pixel PXL2 sequentially arranged in the display area DA along the second direction DR2. For example, the first pixel PXL1 may be disposed on an n-th horizontal line (for example, an n-th pixel row) and an m-th vertical line (for example, an m-th pixel column) of the display area DA, and the second pixel PXL2 may be disposed on an (n+1)th horizontal line (for example, an (n+1)th pixel row) and the m-th vertical line of the display area DA, where n and m may be natural numbers. The first pixel PXL1 and the second pixel PXL2 may be disposed on the same vertical line in the display area DA and may be vertically adjacent to each other in the second direction DR2.

Referring to FIGS. 3 to 6, the display area DA may include pixels PXL including the first pixel PXL1 and the second pixel PXL2, and scan lines SL, data lines DL, sensing lines SENL, the first power source line PL1, and the second power line PL2 connected to the pixels PXL. Also, the display area DA may selectively include control lines SSL. In an embodiment, the control line SSL of each horizontal line may be integrated with the scan line SL of a corresponding horizontal line. In an embodiment, the control line SSL of each horizontal line may be formed separately from the scan line SL of the corresponding horizontal line. Each control line SSL may be formed to extend along the first direction DR1 in the display area DA or may be formed as a mesh-type line including a first sub-control line extending along the first direction DR1 and a second sub-control line extending along the second direction DR2.

The scan lines SL may be formed for each horizontal line. Each scan line SL may be connected to pixel circuits PXC of the sub-pixels SPX disposed on the corresponding horizontal line.

In an embodiment, each scan line SL may include sub-scan lines extending in the first direction DR1 and the second direction DR2, respectively, in the display area DA. For example, an n-th scan line SLn may include a first sub-scan line SLn_H disposed on the n-th horizontal line of the display area DA and extending in the first direction DR1, and a second sub-scan line SLn_V extending in the second direction DR2 in the display area DA to intersect the first sub-scan line SLn_H and connected to the first sub-scan line SLn_H. Similarly, an (n+1)th scan line SLn+1 may include a first sub-scan line SLn+1_H disposed on the (n+1)th horizontal line of the display area DA and extending in the first direction DR1, and a second sub-scan line SLn+1_V extending in the second direction DR2 in the display area DA to intersect the first sub-scan line SLn+1_H and connected to the first sub-scan line SLn+1_H.

When the scan lines SL are formed in the first direction DR1 and the second direction DR2, positions of the pads and/or the driving circuit (for example, the scan driver) may be freely changed. For example, even when the display device DD is a short-side driving type display device, each scan signal may be supplied to the pixels PXL in units of horizontal lines.

The data lines DL may extend along the second direction DR2 in the display area DA and there may be a data line DL for each vertical line. However, the embodiments are not limited thereto. For example, there may be one data line DL for every two adjacent vertical lines, and the two vertical lines may share the data line DL. By separating the scan lines SL connected to the pixels PXL of the two vertical lines, the time when each data signal is input to the pixels PXL may be divided.

Each data line DL may be connected to the pixel circuits PXC of the sub-pixels SPX disposed on a corresponding vertical line. Each data line DL may include sub-data lines that are connected to the sub-pixels SPX constituting each pixel PXL. For example, an m-th data line DLm may include a first sub-data line D1 connected to first sub-pixels SPX1 of the pixels PXL disposed on the m-th vertical line, a second sub-data line D2 connected to second sub-pixels SPX2 of the pixels PXL disposed on the m-th vertical line, and a third sub-data line D3 connected to third sub-pixels SPX3 of the pixels PXL disposed on the m-th vertical line. Accordingly, the data signal may be respectively supplied to each sub-pixel SPX.

The sensing lines SENL may extend along the second direction DR2 in the display area DA and may be formed for at least one vertical line. In an embodiment, the sensing lines SENL may be formed for each vertical line and may be commonly connected to the sub-pixels SPX constituting each pixel PXL. The characteristics of each pixel PXL may be individually detected. In an embodiment, the sensing lines SENL may be shared by multiple vertical lines, and the characteristics of blocks of pixels PXL, organized in units may be detected.

The first power source line PL1 and the second power source line PL2 may be commonly connected to the pixels PXL of the display area DA. For example, the first power source line PL1 may be commonly connected to the pixel circuits PXC of the sub-pixels SPX, and the second power source line PL2 may be commonly connected to the light emitting units EMU of the sub-pixels SPX.

In an embodiment, each of the first power source line PL1 and the second power source line PL2 may be formed in a mesh shape to prevent or minimize voltage drop (IR drop) of the first power source VDD and the second power source VSS. Accordingly, the first power source VDD and the second power source VSS having a uniform level may be transmitted to the pixels PXL.

For example, the first power source line PL1 may include at least one (1-1)th sub-power source line PL1_H (also referred to as a first horizontal power source line) extending in the first direction DR1 in the display area DA, and at least one (1-2)th sub-power source line PL1_V (also referred to as a first vertical power source line) extending in the second direction DR2 in the display area DA and connected to the (1-1)th sub-power source line PL1_H. The at least one (1-1)th sub-power source line PL1_H and the at least one (1-2)th sub-power source line PL1_V may intersect with each other and may be connected to each other at all or some of the intersection points.

Similarly, the second power source line PL2 may include at least one (1-1)th sub-power source line PL2_H (also referred to as a second horizontal power source line) extending in the first direction DR1 in the display area DA, and at least one (2-2)th sub-power source line PL2_V (also referred to as a second vertical power source line) extending in the second direction DR2 in the display area DA and connected to the (1-1)th sub-power source line PL2_H. The at least one (1-1)th sub-power source line PL2_H and the at least one (2-2)th sub-power source line PL2_V may intersect with each other and may be connected to each other at all or some of intersection points.

In an embodiment, the (1-1)th sub-power source line PL1_H and the (1-1)th sub-power source line PL2_H may be formed for each horizontal line or multiple horizontal lines. For example, the (1-1)th sub-power source line PL1_H and the (1-1)th sub-power source line PL2_H may be alternately arranged in the display area DA along the second direction DR2 with the pixels PXL disposed on each horizontal line interposed between each line. For example, the (1-1)th sub-power source line PL1_H may be positioned in an upper area of a pixel row located on an odd-numbered horizontal line, and the (1-1)th sub-power source line PL2_H may be formed in an upper area of a pixel row located on an even-numbered horizontal line. A pair of the (1-1)th sub-power source line PL1_H and the (1-1)th sub-power source line PL2_H adjacent to each other may be spaced apart from each other with the pixel circuits PXC arranged in a pixel row of each horizontal line interposed between the pixel rows.

For example, any of (1-1)th sub-power source lines PL1_H may be disposed in an upper area of the first pixel PXL1 (for example, around the first sub-scan line SLn_H of the n-th scan line SLn). Any of (1-1)th sub-power source lines PL2_H may be disposed between the first pixel PXL1 and the second pixel PXL2 (for example, around the first sub-scan line SLn+1_H of the (n+1)th scan line SLn+1). Any of (1-1)th sub-power source lines PL1_H may be disposed in a lower area of the second pixel PXL2 (for example, around a first sub-scan line SLn+2_H of an (n+2)th scan line). The number and/or position of the (1-1)th sub-power source line PL1_H and the (1-1)th sub-power source line PL2_H may vary according to embodiments.

In an embodiment, the (1-2)th sub-power source line PL1_V and the (2-2)th sub-power source line PL2_V may be formed for at least one vertical line. For example, the (1-2)th sub-power source line PL1_V and the (2-2)th sub-power source line PL2_V may be formed for each vertical line and may be spaced apart from each other with the pixel circuits PXC arranged in a pixel column of the corresponding vertical line interposed therebetween. The number and/or position of the (1-2)th sub-power source line PL1_V and the (2-2)th sub-power source line PL2_V may vary according to embodiments.

Each pixel PXL may include sub-pixels SPX. For example, each pixel PXL may include the first sub-pixel SPX1, the second sub-pixel SPX2, and the third sub-pixel SPX3.

Each sub-pixel SPX may include the pixel circuit PXC and the light emitting unit EMU. For example, the first sub-pixel SPX1 may include a first pixel circuit PXC1 and a first light emitting unit EMU1, the second sub-pixel SPX2 may include a second pixel circuit PXC2 and a second light emitting unit EMU2, and the third sub-pixel SPX3 may include a third pixel circuit PXC3 and a third light emitting unit EMU3.

The pixel circuits PXC and the light emitting units EMU of each pixel PXL may be disposed on different layers and may overlap each other. For example, the pixel circuits PXC may be disposed in a pixel circuit layer (for example, a pixel circuit layer PCL of FIGS. 9 and 10) of a pixel area PXA in which each pixel PXL is disposed. The light emitting units EMU may be disposed in a display element layer (for example, a display element layer DPL of FIGS. 9 and 10) of each pixel area PXA to overlap the pixel circuits PXC of a corresponding pixel PXL.

In an embodiment, the first, second, and third pixel circuits PXC1, PXC2, and PXC3 may be arranged along the second direction DR2 in each pixel area PXA. For example, the first, second, and third pixel circuits PXC1, PXC2, and PXC3 of the first pixel PXL1 may be arranged along the second direction DR2 in a predetermined order in the first pixel area PXA1 in which the first pixel PXL1 is provided. Similarly, the first, second, and third pixel circuits PXC1, PXC2, and PXC3 of the second pixel PXL2 may be arranged in a predetermined order along the second direction DR2 in a second pixel area PXA2 in which the second pixel PXL2 is provided. In an embodiment, the third pixel circuit PXC3 may be positioned at the center of each pixel area PXA in the first direction DR1, and the first and second pixel circuits PXC1 and PXC2 may be disposed on both sides of the third pixel circuit PXC3 in the first direction DR1. The position and/or arrangement order of the pixel circuits PXC may vary.

The direction in which the pixel circuits PXC are arranged may also change according to embodiments. For example, in an embodiment, the first, second, and third pixel circuits PXC1, PXC2, and PXC3 may be arranged in a predetermined order along the first direction DR1 in each pixel area PXA.

The first, second, and third pixel circuits PXC1, PXC2, and PXC3 may be connected to a common first power source line PL1 and a common scan line SL of the corresponding horizontal line and may be connected to different sub-data lines of the corresponding vertical line. For example, the first pixel circuit PXC1 may be connected to the first sub-data line D1, the second pixel circuit PXC2 may be connected to the second sub-data line D2, and the third pixel circuit PXC3 may be connected to the third sub-data line D3.

The first, second, and third pixel circuits PXC1, PXC2, and PXC3 may be selectively connected to the sensing line SENL. For example, the first, second, and third pixel circuits PXC1, PXC2, and PXC3 may all be connected to the sensing line SENL of the corresponding vertical line.

The first, second, and third light emitting units EMU1, EMU2, and EMU3 may be electrically connected between each pixel circuit PXC and the second power source line PL2. For example, the first, second, and third light emitting units EMU1, EMU2, and EMU3 may be electrically connected to the first, second, and third pixel circuits PXC1, PXC2, and PXC3, respectively. The first, second, and third light emitting units EMU1, EMU2, and EMU3 may be electrically connected to the second power source line PL2 (for example, any one of the (1-1)th sub-power source lines PL2_H).

In an embodiment, the first, second, and third light emitting units EMU1, EMU2, and EMU3 may be arranged along the first direction DR1 in each pixel area PXA. For example, the first, second, and third light emitting units EMU1, EMU2, and EMU3 of the first pixel PXL1 may be sequentially arranged along the first direction DR1 in the first pixel area PXA1 in which the first pixel PXL1 is provided. Similarly, the first, second, and third light emitting units EMU1, EMU2, and EMU3 of the second pixel PXL2 may be sequentially arranged along the first direction DR1 in the second pixel area PXA2 in which the second pixel PXL2 is provided. The first, second, and third sub-pixels SPX1, SPX2, and SPX3 may include sub-emission areas corresponding to at least one area (or a portion) of the first, second, and third light emitting units EMU1, EMU2, and EMU3, respectively. Accordingly, the sub-emission areas of the first, second, and third sub-pixels SPX1, SPX2, and SPX3 may be sequentially arranged along the first direction DR1. However, the position, arrangement order, and/or arrangement direction of the light emitting units EMU may vary according to embodiments.

In the embodiment illustrated in FIG. 6, the pixel circuits PXC and the light emitting units EMU of the sub-pixels SPX are arranged in different directions in each pixel area PXA, but the embodiments are limited thereto. For example, the position and/or arrangement direction of the pixel circuits PXC and the light emitting units EMU may vary according to embodiments.

In an embodiment, the light emitting units EMU may be disposed to substantially avoid overlapping the lines (for example, signal lines and power source lines positioned around each pixel PXL) except for contact portions for connecting the pixel circuits PXC and the second power source line PL2, and/or the periphery thereof. For example, the light emitting units EMU may be disposed inside each pixel area PXA positioned between the lines when viewed on a plane. Accordingly, interference of electromagnetic signals that may be caused by the lines in a process of aligning the light emitting elements LD can be prevented and/or reduced, and alignment characteristics of the light emitting elements LD can be improved.

Figure 7:
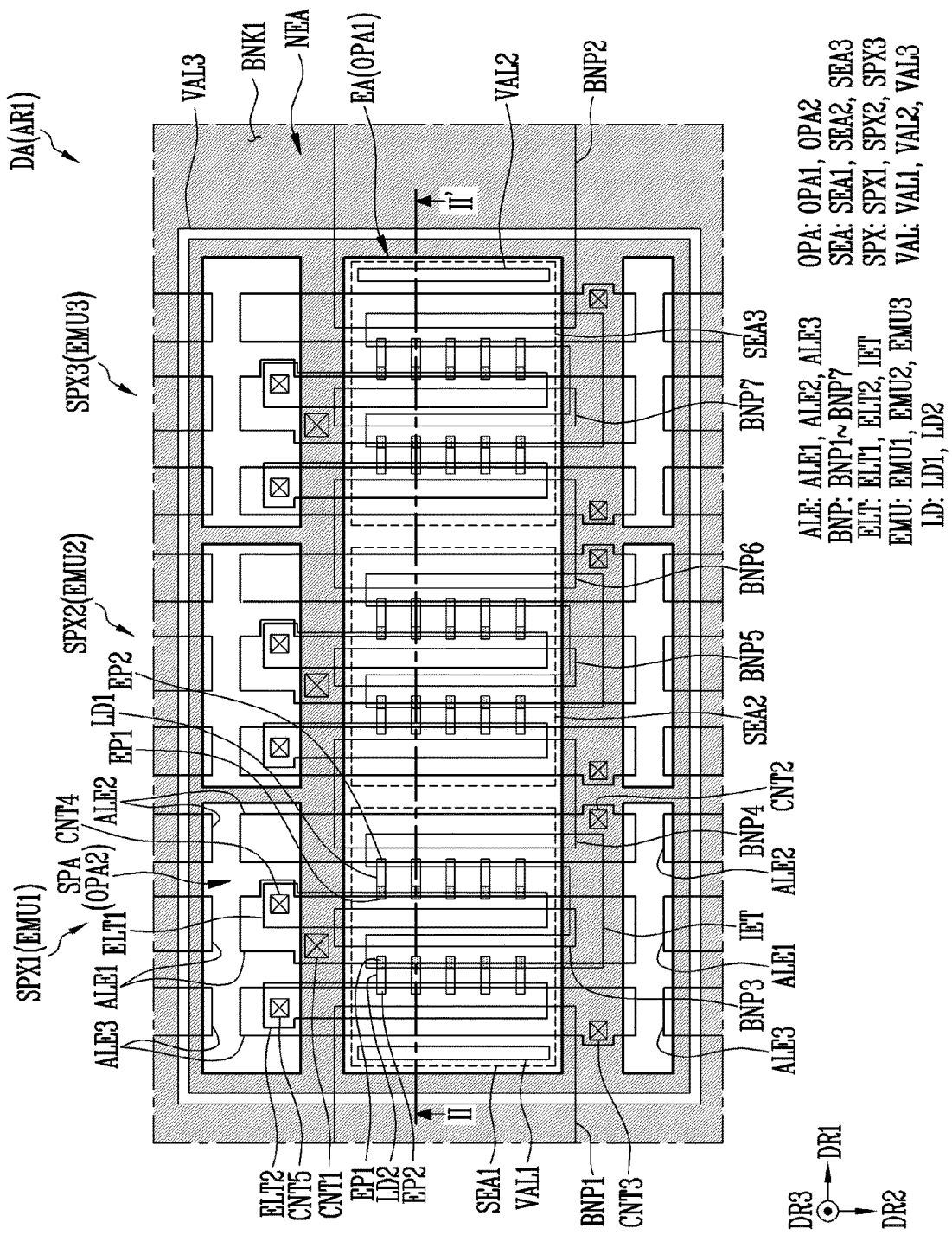
FIG. 7 is a schematic plan view illustrating a display area according to an embodiment.

FIG. 7 is a plan view illustrating a display area DA according to an embodiment. For example, FIG. 7 shows an area of the display area DA corresponding to the area AR1 of FIG. 6, and shows a structure of the sub-pixels SPX and the pixel PXL (for example, the first pixel PXL1) including the sub-pixels SPX based on the light emitting units EMU. As in the embodiment illustrated in FIG. 5, in FIG. 7, the light emitting units EMU include light emitting elements LD connected in series and light emitting elements LD connected in parallel between the first pixel electrode ELT1 and the second pixel electrode ELT2.

Referring to FIGS. 3 to 7, the pixel PXL may include an emission area EA in which the light emitting elements LD of the sub-pixels SPX are disposed. The emission area EA of the pixel PXL may include sub-emission areas SEA corresponding to the sub-pixels SPX constituting the corresponding pixel PXL.

For example, the first sub-pixel SPX1 may include a first sub-emission area SEA1 including at least one light emitting element LD and electrodes disposed around the light emitting element LD. The second sub-pixel SPX2 may include a second sub-emission area SEA2 positioned around the first sub-emission area SEA1 and including at least one light emitting element LD and electrodes disposed around the light emitting element LD. The third sub-pixel SPX3 may include a third sub-emission area SEA3 positioned around the first sub-emission area SEA1 and/or the second sub-emission area SEA2 and including at least one light emitting element LD and electrodes disposed around the light emitting element LD. The pixel PXL including the first, second, and third sub-pixels SPX1, SPX2, and SPX3 may include the emission area EA including the first, second, and third sub-emission areas SEA1, SEA2, and SEA3.

In an embodiment, the sub-pixels SPX may be formed to have substantially similar or substantially the same structure. Accordingly, in FIG. 7, reference numerals and explanations describing elements of the first sub-pixel SPX1 apply to the other sub-pixels SPX2 and SPX3.

In an embodiment, each sub-emission area SEA may include light emitting elements LD and electrodes electrically connected to the light emitting elements LD. In an embodiment, the electrodes may include alignment electrodes ALE and pixel electrodes ELT. Each sub-emission area SEA may include bank patterns BNP disposed under the electrodes.

The alignment electrodes ALE may have various shapes and may be spaced apart from each other. In an embodiment, the alignment electrodes ALE may be spaced apart from each other in the first direction DR1, and each of the alignment electrodes ALE may have a shape (for example, the bar-like shape) extending along the second direction DR2.

The shape, size, number, position, and/or mutual arrangement structure of the alignment electrodes ALE may vary according to embodiments. Also, the alignment electrodes ALE may have a shape and/or size substantially similar to or substantially the same as each other or may have different shapes and sizes.

The alignment electrodes ALE may include at least two electrodes spaced apart from each other. For example, the alignment electrodes ALE may include a first alignment electrode ALE1 and a second alignment electrode ALE2, and may optionally further include a third alignment electrode ALE3.

In an embodiment, the first alignment electrode ALE1 may be positioned at the center of each sub-emission area SEA, and the second alignment electrode ALE2 and the third alignment electrode ALE3 may be disposed on both sides of the first alignment electrode ALE1. For example, the second alignment electrode ALE2 may be disposed on the right side of the first alignment electrode ALE1, and the third alignment electrode ALE3 may be disposed on the left side of the first alignment electrode ALE1.

The alignment electrodes ALE (or alignment lines before being separated into the alignment electrodes ALE of each of the sub-pixels SPX) may receive alignment signals necessary for aligning the light emitting elements LD in the manufacturing process. Accordingly, an electric field may be formed between the alignment electrodes ALE so that the light emitting elements LD can be aligned and/or arranged between the alignment electrodes ALE. Here, the expression that the light emitting elements LD are aligned and/or arranged between the alignment electrodes ALE may mean that at least a portion of each of the light emitting elements LD is disposed between the alignment electrodes ALE.

For example, the first alignment electrode ALE1, the second alignment electrode ALE2, and the third alignment electrode ALE3 (or a first alignment line in which first alignment electrodes ALE1 of the sub-pixels SPX are connected, a second alignment line in which second alignment electrodes ALE2 of the sub-pixels SPX are connected, and a third alignment line in which third alignment electrodes ALE3 of the sub-pixels SPX are connected) may receive a first alignment signal, a second alignment signal, and a third alignment signal, respectively, when aligning the light emitting elements LD. The first alignment signal and the second alignment signal may have different waveforms, potentials and/or phases. Accordingly, an electric field may be formed between the first alignment electrode ALE1 and the second alignment electrode ALE2, so that the light emitting elements LD (for example, the first light emitting elements LD1) may be aligned between the first alignment electrode ALE1 and the second alignment electrode ALE2. The first alignment signal and the third alignment signal may have different waveforms, potentials and/or phases. Accordingly, an electric field may be formed between the first alignment electrode ALE1 and the third alignment electrode ALE3, so that the light emitting elements LD (for example, the second light emitting elements LD2) may be aligned between the first alignment electrode ALE1 and the third alignment electrode ALE3. The third alignment signal and the second alignment signal may be the same or may be different from each other.

The alignment electrodes ALE may be disposed at least in each sub-emission area SEA and may extend to a separation area SPA through a non-emission area NEA around the sub-emission area SEA. The separation area SPA may be an area in which each alignment line (for example, the first alignment line, the second alignment line, and the third alignment line) is separated into the alignment electrodes ALE (for example, the first alignment electrode ALE1, the second alignment electrode ALE2, and the third alignment electrode ALE3) of each of the sub-pixels SPX after the alignment of the light emitting elements LD is completed, and may be disposed on at least one side of each sub-emission area SEA.

For example, each pixel PXL may include at least one separation area SPA disposed around the emission area EA. An end of at least one electrode constituting the pixel PXL (for example, one of the ends of the alignment electrodes ALE) may be disposed in each separation area SPA.

In an embodiment, the separation area SPA may be disposed above and below each sub-emission area SEA. Separation areas SPA of the sub-pixels SPX may be separated from each other, but the embodiments are not limited thereto. For example, the separation areas SPA positioned above or below the first, second, and third sub-emission areas SEA1, SEA2, and SEA3 may be integrated with each other.

In an embodiment, each alignment electrode ALE may have an individual pattern separated for each sub-pixel SPX. For example, each of the first, second, and third alignment electrodes ALE1, ALE2, and ALE3 of each of the sub-pixels SPX may have the individual pattern separated. However, the embodiments are not limited thereto. For example, in a structure in which the second pixel electrodes ELT2 of the sub-pixels SPX are commonly connected to the second power source line PL2, the alignment electrodes ALE connected to the second pixel electrodes ELT2 (for example, the third alignment electrodes ALE3 of the sub-pixels SPX) may be formed integrally with each other without breaking between the sub-emission areas SEA adjacent to each other in the first direction DR1 and/or the second direction DR2.

In an embodiment, the first alignment electrode ALE1 may be connected to the pixel circuit PXC and/or the first power source line PL1 disposed in the pixel circuit layer (for example, the pixel circuit layer PCL of FIGS. 9 and 10) through a first contact portion CNT1. The first alignment signal may be supplied to the first alignment electrode ALE1 (or the first alignment line) through at least one line (for example, the first power source line PL1) located in the pixel circuit layer.

The first contact portion CNT1 may include at least one contact hole and/or via hole. In an embodiment, the first contact portion CNT1 may be positioned in the non-emission area NEA located around each sub-emission area SEA, but the position of the first contact portion CNT1 is not limited thereto. For example, the first contact portion CNT1 may be disposed in each sub-emission area SEA or separation area SPA. Referring to FIG. 7, first contact portions CNT1 are disposed at substantially the same position in the first, second, and third sub-emission areas SEA1, SEA2, and SEA3, but the positions of the first contact portions CNT1 may vary according to the structures of the pixel circuit PXC and the light emitting unit EMU of each sub-pixel SPX. For example, when each first alignment electrode ALE1 and a circuit element (for example, the first transistor and/or the capacitor Cst of FIGS. 4 and 5) and/or a line (for example, the first power source line PL1) connected to the first alignment electrode ALE1 can be electrically connected, the position of the first contact portion CNT1 may not be particularly limited.

In an embodiment, the second alignment electrode ALE2 may be connected to the second power source line PL2 positioned in the pixel circuit layer through a second contact portion CNT2. The second alignment signal may be supplied to the second alignment electrode ALE2 (or the second alignment line) through the second power source line PL2.

Similarly, the third alignment electrode ALE3 may be connected to the second power source line PL2 positioned in the pixel circuit layer through a third contact portion CNT3. The second alignment signal may also be supplied to the third alignment electrode ALE3 (or the third alignment line) through the second power source line PL2.

Each of the second contact portion CNT2 and the third contact portion CNT3 may include at least one contact hole and/or at least one via hole. In an embodiment, the second contact portion CNT2 and the third contact portion CNT3 may be positioned in the non-emission area NEA located around each sub-emission area SEA, but the positions of the second contact portion CNT2 and the third contact portion CNT3 are not limited thereto. For example, the second contact portion CNT2 and the third contact portion CNT3 may be disposed in each sub-emission area SEA or separation area SPA. Referring to FIG. 7, second contact portions CNT2 and third contact portions CNT3 are disposed at substantially the same position in the first, second and third sub-emission areas SEA1, SEA2, and SEA3, but the positions of the second contact portions CNT2 and the third contact portions CNT3 may vary according to the structures of the pixel circuit PXC and the light emitting unit EMU of each sub-pixel SPX.

At least one first light emitting element LD1 may be arranged between the first alignment electrode ALE1 and the second alignment electrode ALE2. For example, the first light emitting elements LD1 may be arranged between the first alignment electrode ALE1 and the second alignment electrode ALE2.

Each of the first light emitting elements LD1 may or may not overlap the first alignment electrode ALE1 and/or the second alignment electrode ALE2. The first end EP1 of the first light emitting element LD1 may be disposed adjacent to the first alignment electrode ALE1, and the second end EP2 of the first light emitting element LD1 may be disposed adjacent to the second alignment electrode ALE2.

The first end EP1 of the first light emitting element LD1 may be electrically connected to the first pixel electrode ELT1. In an embodiment, the first end EP1 of the first light emitting element LD1 may be connected to the first alignment electrode ALE1 through the first pixel electrode ELT1 and electrically connected to the pixel circuit PXC and/or the first power source line PL1 through the first alignment electrode ALE1.

The second end EP2 of the first light emitting element LD1 may be electrically connected to the intermediate electrode IET and/or the second pixel electrode ELT2. In an embodiment, the second end EP2 of the first light emitting element LD1 may be electrically connected to the intermediate electrode IET. The second end EP2 of the first light emitting element LD1 may be electrically connected to the second power source line PL2 via the intermediate electrode IET, at least one second light emitting element LD2, the second pixel electrode ELT2, and the third alignment electrode ALE3.

At least one second light emitting element LD2 may be arranged between the first alignment electrode ALE1 and the third alignment electrode ALE3. For example, the second light emitting elements LD2 may be arranged between the first alignment electrode ALE1 and the third alignment electrode ALE3.

Each of the second light emitting elements LD2 may or may not overlap the first alignment electrode ALE1 and/or the third alignment electrode ALE3. The first end EP1 of the second light emitting element LD2 may be disposed adjacent to the first alignment electrode ALE1, and the second end EP2 of the second light emitting element LD2 may be disposed adjacent to the third alignment electrode ALE3.

The first end EP1 of the second light emitting element LD2 may be electrically connected to the intermediate electrode IET. The second end EP2 of the second light emitting element LD2 may be electrically connected to the second pixel electrode ELT2. In an embodiment, the second end EP2 of the second light emitting element LD2 may be connected to the third alignment electrode ALE3 through the second pixel electrode ELT2, and electrically connected to the second power source line PL2 through the third alignment electrode ALE3.

In an embodiment, each light emitting element LD may be an inorganic light emitting element formed of a material having an inorganic crystalline structure, and having an ultra-small size (for example, having a size in a range of nanometers to micrometers). For example, each light emitting element LD may be an inorganic light emitting element having an ultra-small size manufactured in a rod-like shape as shown in FIGS. 1 and 2 by growing a nitride-based semiconductor. However, the type, size, shape, structure, and/or number of the light emitting elements LD constituting each light emitting unit EMU may be changed.

The light emitting elements LD may be dispersed in a solution and may be supplied to each emission area EA by an inkjet method, a slit coating method, or the like. When the alignment signals are applied to the alignment electrodes ALE (or the alignment lines) of the sub-pixels SPX at the same time or after the light emitting elements LD are supplied, an electric field may be formed between the alignment electrodes ALE to align the light emitting elements LD. After the light emitting elements LD are aligned, a solvent may be removed by a drying process or the like.

The first pixel electrode ELT1 may be disposed on the first ends EP1 of the first light emitting elements LD1 and may be electrically connected to the first ends EP1 of the first light emitting elements LD1. For example, the first pixel electrode ELT1 may be directly disposed on the first ends EP1 of the first light emitting elements LD1 so as to be in contact with the first ends EP1 of the first light emitting elements LD1.

In an embodiment, the first pixel electrode ELT1 may overlap the first alignment electrode ALE1 and may be electrically connected to the first alignment electrode ALE1 through a fourth contact portion CNT4. The first pixel electrode ELT1 may be electrically connected to the pixel circuit PXC and/or the first power source line PL1 through the first alignment electrode ALE1. In other embodiments, the first pixel electrode ELT1 may be electrically connected to the pixel circuit PXC and/or the first power source line PL1 without passing through the first alignment electrode ALE1.

The intermediate electrode IET may be disposed on the second ends EP2 of the first light emitting elements LD1 and the first ends EP1 of the second light emitting elements LD2 and may be electrically connected to the second ends EP2 of the first light emitting elements LD1 and the first ends EP1 of the second light emitting elements LD2. For example, the intermediate electrode IET may be directly disposed on the second ends EP2 of the first light emitting elements LD1 and the first ends EP1 of the second light emitting elements LD2 so as to be in contact with the second ends EP2 of the first light emitting elements LD1 and the first ends EP1 of the second light emitting elements LD2. In an embodiment, the intermediate electrode IET may overlap a portion of each of the first and second alignment electrodes ALE1 and ALE2, but the embodiments are not limited thereto.

The second pixel electrode ELT2 may be disposed on the second ends EP2 of the second light emitting elements LD2 and may be electrically connected to the second ends EP2 of the second light emitting elements LD2. For example, the second pixel electrode ELT2 may be directly disposed on the second ends EP2 of the second light emitting elements LD2, and may contact the second ends EP2 of the second light emitting elements LD2.

In an embodiment, the second pixel electrode ELT2 may overlap the third alignment electrode ALE3 and may be electrically connected to the third alignment electrode ALE3 through a fifth contact portion CNT5. The second pixel electrode ELT2 may be electrically connected to the second power source line PL2 through the third alignment electrode ALE3. In another embodiment, the second pixel electrode ELT2 may be electrically connected to the second power source line PL2 without passing through the third alignment electrode ALE3.

The pixel electrodes ELT (for example, the first pixel electrode ELT1, the intermediate electrode IET, and the second pixel electrode ELT2) may be formed in at least each of the sub-emission areas SEA. In an embodiment, at least one pixel electrode ELT may extend from each sub-emission area SEA to the non-emission area NEA and/or the separation area SPA. For example, the first and second pixel electrodes ELT1 and ELT2 may extend from each sub-emission area SEA to the non-emission area NEA and the separation area SPA, and may be electrically connected to the first and third alignment electrodes ALE1 and ALE3 in the separation area SPA, respectively. The intermediate electrode IET may be formed only in each sub-emission area SEA, or a portion thereof may be positioned in the non-emission area NEA. The position, size, shape, and mutual arrangement structure of the pixel electrodes ELT and/or positions of the fourth and fifth contact portions CNT4 and CNT5 may vary according to embodiments.

The bank patterns BNP (also referred to as patterns or wall patterns) may be disposed under the electrodes to overlap a portion of the electrodes disposed in the sub-emission areas SEA. For example, the bank patterns BNP may include first to seventh bank patterns BNP partially overlapping the alignment electrodes ALE disposed in the sub-emission areas SEA of the pixel PXL. In an embodiment, at least one bank pattern BNP may extend to the non-emission area NEA around the emission area EA, but the embodiments are not limited thereto.

The first bank pattern BNP1 may be positioned in a first edge area (for example, a left edge area) of the emission area EA in the first direction DR1. For example, the first bank pattern BNP1 may be positioned in a left edge area of the first sub-emission area SEA1. In an embodiment, the first bank pattern BNP1 may overlap the third alignment electrode ALE3 of the first sub-pixel SPX1. The first bank pattern BNP1 may or may not overlap the second pixel electrode ELT2 of the first sub-pixel SPX1.

The first bank pattern BNP1 may include a first valley VAL1. In an embodiment, the first valley VAL1 may be an opening or a groove (or a trench) formed in a portion of the first bank pattern BNP1.

The first valley VAL1 may be positioned in the first edge area of the emission area EA in the first direction DR1. For example, the first valley VAL1 may be disposed in the left edge area of the first sub-emission area SEA1 so as to be positioned outside the electrodes of the first sub-pixel SPX1 in the first direction DR1.

In an embodiment, the first valley VAL1 may be a slit-shaped valley extending in the second direction DR2 intersecting the first direction DR1. For example, the first valley VAL1 may be formed in the first bank pattern BNP1 within a space that can be secured in the first edge area of the emission area EA.

The second bank pattern BNP2 may be positioned in a second edge area (for example, a right edge area) of the emission area EA in the first direction DR1. For example, the second bank pattern BNP2 may be positioned at a right edge area of the third sub-emission area SEA3. In an embodiment, the second bank pattern BNP2 may overlap the second alignment electrode ALE2 of the third sub-pixel SPX3. The second bank pattern BNP2 may or may not overlap the intermediate electrode IET of the third sub-pixel SPX3.

The second bank pattern BNP2 may include a second valley VAL2. In an embodiment, the second valley VAL2 may be an opening or a groove (or a trench) formed in a portion of the second bank pattern BNP2.

The second valley VAL2 may be positioned in the second edge area of the emission area EA in the first direction DR1. For example, the second valley VAL2 may be disposed in the right edge area of the third sub-emission area SEA3 so as to be positioned outside the electrodes of the third sub-pixel SPX3 in the first direction DR1.

In an embodiment, the second valley VAL2 may be a slit-shaped valley extending in the second direction DR2 intersecting the first direction DR1. For example, the second valley VAL2 may be formed in the second bank pattern BNP2 within a space that can be secured in the second edge area of the emission area EA.

The third to seventh bank patterns BNP3 to BNP7 may be disposed between the first bank pattern BNP1 and the second bank pattern BNP2. For example, the third to seventh bank patterns BNP3 to BNP7 may be sequentially arranged in the first direction DR1 between the first bank pattern BNP1 and the second bank pattern BNP2.

The third bank pattern BNP3 may be positioned in the first sub-emission area SEA1 and may overlap the first alignment electrode ALE1 of the first sub-pixel SPX1. The third bank pattern BNP3 may or may not overlap the first pixel electrode ELT1 and/or the intermediate electrode IET of the first sub-pixel SPX1.

The fourth bank pattern BNP4 may be positioned in the first and second sub-emission areas SEA1 and SEA2, and may overlap the second alignment electrode ALE2 of the first sub-pixel SPX1 and the third alignment electrode ALE3 of the second sub-pixel SPX2. FIG. 7 shows an embodiment in which the second alignment electrode ALE2 of the first sub-pixel SPX1 and the third alignment electrode ALE3 of the second sub-pixel SPX2 share one fourth bank pattern BNP4, but the embodiments are not limited thereto. For example, in an embodiment, the fourth bank pattern BNP4 may be divided into two patterns disposed in each sub-emission area SEA. The fourth bank pattern BNP4 may or may not overlap the intermediate electrode IET of the first sub-pixel SPX1 and/or the second pixel electrode ELT2 of the second sub-pixel SPX2.

The fifth bank pattern BNP5 may be positioned in the second sub-emission area SEA2 and may overlap the first alignment electrode ALE1 of the second sub-pixel SPX2. The fifth bank pattern BNP5 may or may not overlap the first pixel electrode ELT1 and/or the intermediate electrode IET of the second sub-pixel SPX2.

The sixth bank pattern BNP6 may be positioned in the second and third sub-emission areas SEA2 and SEA3, and may overlap the second alignment electrode ALE2 of the second sub-pixel SPX2 and the third alignment electrode ALE3 of the third sub-pixel SPX3. FIG. 7 shows an embodiment in which the second alignment electrode ALE2 of the second sub-pixel SPX2 and the third alignment electrode ALE3 of the third sub-pixel SPX3 share one sixth bank pattern BNP6, but the embodiments are not limited thereto. For example, in another embodiment, the sixth bank pattern BNP6 may be divided into two patterns disposed in each sub-emission area SEA. The sixth bank pattern BNP6 may or may not overlap the intermediate electrode IET of the second sub-pixel SPX2 and/or the second pixel electrode ELT2 of the third sub-pixel SPX3.

The seventh bank pattern BNP7 may be positioned in the third sub-emission area SEA3 and may overlap the first alignment electrode ALE1 of the third sub-pixel SPX3. The seventh bank pattern BNP7 may or may not overlap the first pixel electrode ELT1 and/or the intermediate electrode IET of the third sub-pixel SPX3.

In an embodiment, the bank patterns BNP may include a hydrophobic surface. For example, by forming the bank patterns BNP themselves as hydrophobic patterns using a hydrophobic material or by forming a hydrophobic thin film made of the hydrophobic material on the bank patterns BNP, the bank patterns BNP may have the hydrophobic surface. However, in the embodiments, materials and/or surface properties of the bank patterns BNP are not particularly limited.

The non-emission area NEA may be disposed around each emission area EA and/or each separation area SPA. A first bank BNK1 may be disposed in the non-emission area NEA.

The first bank BNK1 may include a first opening OPA1 corresponding to the emission area EA of each pixel PXL and surround the emission area EA. Also, the first bank BNK1 may include second openings OPA2 corresponding to the separation areas SPA and surround the separation areas SPA. For example, the first bank BNK1 may include openings OPA corresponding to each emission area EA and each separation area SPA.

In an embodiment, the first opening OPA1 may be formed to include the sub-emission areas SEA (for example, the first, second, and third sub-emission areas SEA1, SEA2, and SEA3) corresponding to the sub-pixels SPX constituting each pixel PXL. For example, the first opening OPA1 of each pixel PXL may be formed by integrally opening the first bank BNK1 to include the sub-emission areas SEA of each pixel PXL. Compared with the embodiment in which openings are individually formed corresponding to each sub-emission area SEA, the area and/or volume amount of the emission area EA can be increased. For example, in an inkjet process or a slit coating process for supplying the light emitting elements LD, the volume amount of the light emitting element ink that can be accommodated in each emission area EA constituting each inkjet area can be increased.

The first bank BNK1 may include at least one light blocking and/or reflective material. For example, the first bank BNK1 may include at least one black matrix material and/or color filter material of a specific color. Accordingly, light leakage between adjacent pixels PXL can be prevented.

In the step of supplying the light emitting elements LD to each pixel PXL, the first bank BNK1 may define each emission area EA to which the light emitting elements LD are to be supplied. For example, since the emission areas EA of the pixels PXL are separated and partitioned by the first bank BNK1, the desired type and/or amount of light emitting element ink can be supplied to each emission area EA.

In an embodiment, the first bank BNK1 may include a hydrophobic surface. For example, by forming the first bank BNK1 itself as a hydrophobic pattern using a hydrophobic material or by forming a hydrophobic thin film made of the hydrophobic material on the first bank BNK1, the first bank BNK1 may have the hydrophobic surface. For example, the first bank BNK1 may be formed using a hydrophobic organic insulating material having a large contact angle, such as polyacrylate. Accordingly, the first bank BNK1 may be formed as the hydrophobic pattern. Accordingly, the light emitting element ink may stably flow into the emission area EA.

In an embodiment, the first bank BNK1 may include a third valley VAL3. The third valley VAL3 may be an opening or a groove (or a trench) formed in a portion of the first bank BNK1.

The third valley VAL3 may be formed to surround at least the emission area EA. For example, the third valley VAL3 may surround at least the first opening OPA1 and may have a closed shape when viewed on a plane.

Also, the third valley VAL3 may further surround at least one second opening OPA2 positioned around the first opening OPA1. For example, the third valley VAL3 may surround the emission area EA and the separation areas SPA of each pixel PXL at once and/or integrally. Also, the third valley VAL3 may have the closed shape when viewed on a plane, such as a polygonal shape (for example, a rectangular shape having angled or rounded corners), a circular shape, an elliptical shape, or the like.

As in the above-described embodiment, when the first and second valleys VAL1 and VAL2 are formed in the first and second bank patterns BNP1 and BNP2, in the inkjet process or the slit coating process for supplying the light emitting elements LD, the volume amount of the light emitting element ink that can be accommodated in each emission area EA can be increased. Accordingly, a larger amount of the light emitting element ink can be supplied to the emission area EA at one time. Also, when the amount of the light emitting element ink increases, the number of the light emitting elements LD included in the light emitting element ink can also be increased.

When the third valley VAL3 is formed in the first bank BNK1, overflow of the light emitting element ink can be prevented. For example, by forming the third valley VAL3 in the first bank BNK1 may prevent the light emitting element ink from overflowing into the adjacent pixel area PXA.

As described above, by forming the valleys VAL in the first and second bank patterns BNP1 and BNP2 and the first bank BNK1, the volume amount of the light emitting element ink that can be accommodated in the emission area EA can be increased and the overflow can be prevented. Accordingly, the amount of light emitting element ink that can be supplied to each emission area EA at one time can be increased. When the amount of the light emitting element ink that can be supplied to the emission area EA at one time increases, the number of light emitting elements LD that can be applied to the emission area EA at one time can also be increased. Accordingly, in the process efficiency in supplying and aligning the light emitting elements LD may be improved.

For example, the process of applying the light emitting element ink and drying the solvent may have to be repeated multiple times in order to align a sufficient number of the light emitting elements LD in each sub-emission area SEA. By reducing the number of processes of applying the light emitting element ink and drying the solvent, process time required for supplying and aligning the light emitting elements LD may be reduced. Accordingly, manufacturing efficiency of the pixels PXL and the display device DD including the pixels PXL may be improved.

Figure 8:
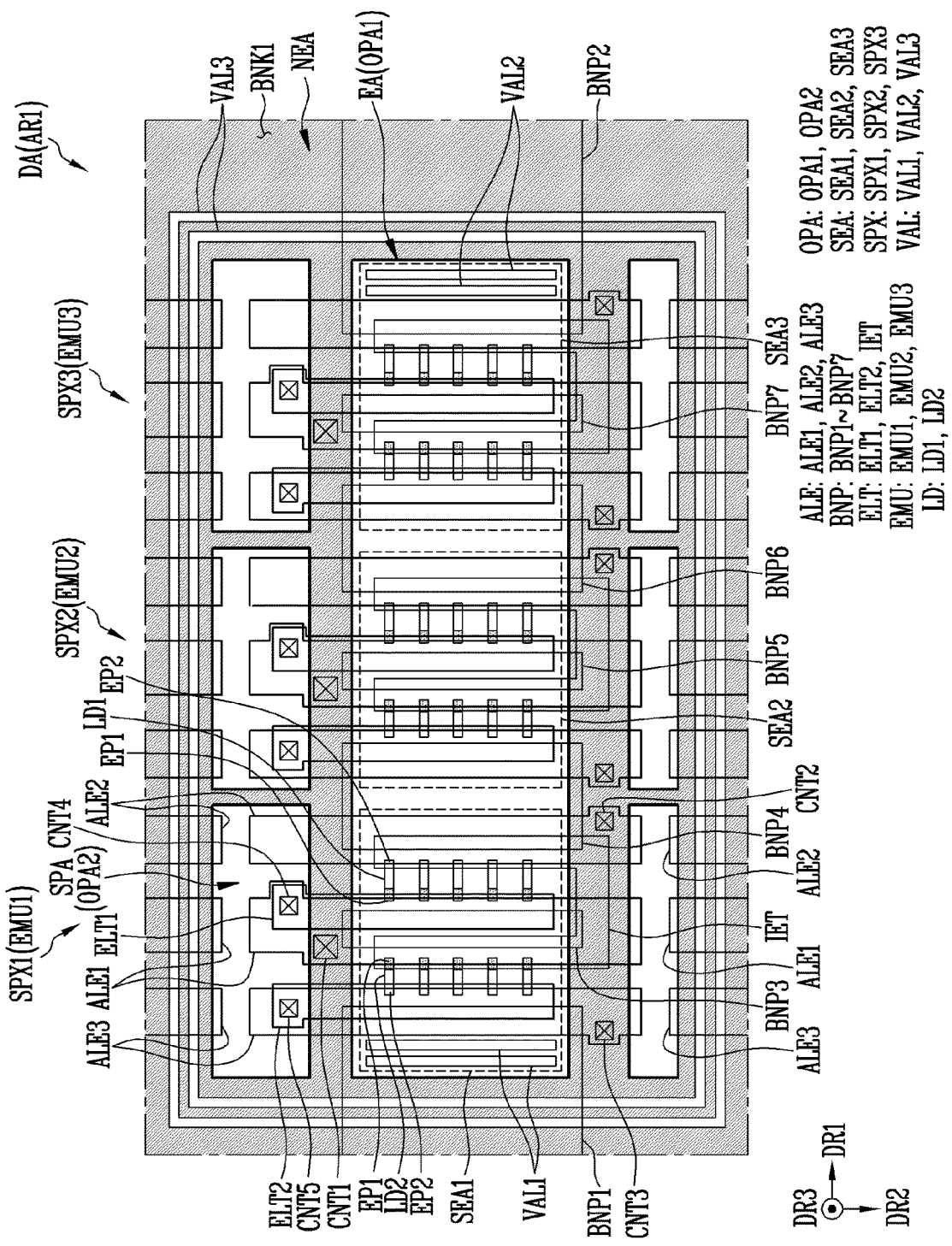
FIG. 8 is a schematic plan view illustrating a display area according to an embodiment.

FIG. 8 is a plan view illustrating a display area DA according to an embodiment. For example, FIG. 8 shows one area of the display area DA corresponding to the area AR1 of FIG. 6 and shows a modified embodiment of FIG. 7. In the embodiment of FIG. 8, components similar to or the same as those of the embodiment of FIG. 7 are given the same reference numerals, and their detailed descriptions will not be repeated.

Referring to FIG. 8, each of the first bank pattern BNP1, the second bank pattern BNP2, and the first bank BNK1 may include multiple valleys VAL. For example, the first bank pattern BNP1 may include two or more first valleys VAL1, and the second bank pattern BNP2 may include two or more second valleys VAL2. The first bank BNK1 may include two or more third valleys VAL3.

In the embodiments of FIGS. 7 and 8, the first bank pattern BNP1, the second bank pattern BNP2, and the first bank BNK1 include the same number of valleys VAL, but the embodiments are not limited thereto. For example, each of the first bank pattern BNP1, the second bank pattern BNP2, and the first bank BNK1 may include at least one valley VAL, and may include the same or different number of valleys VAL. The number, size, and/or shape of the valleys VAL formed in the first bank pattern BNP1, the second bank pattern BNP2, and the first bank BNK1 may vary depending on the space available for forming the valleys VAL and/or the increased volume of the emission area EA due to the valleys VAL.

Figure 9:
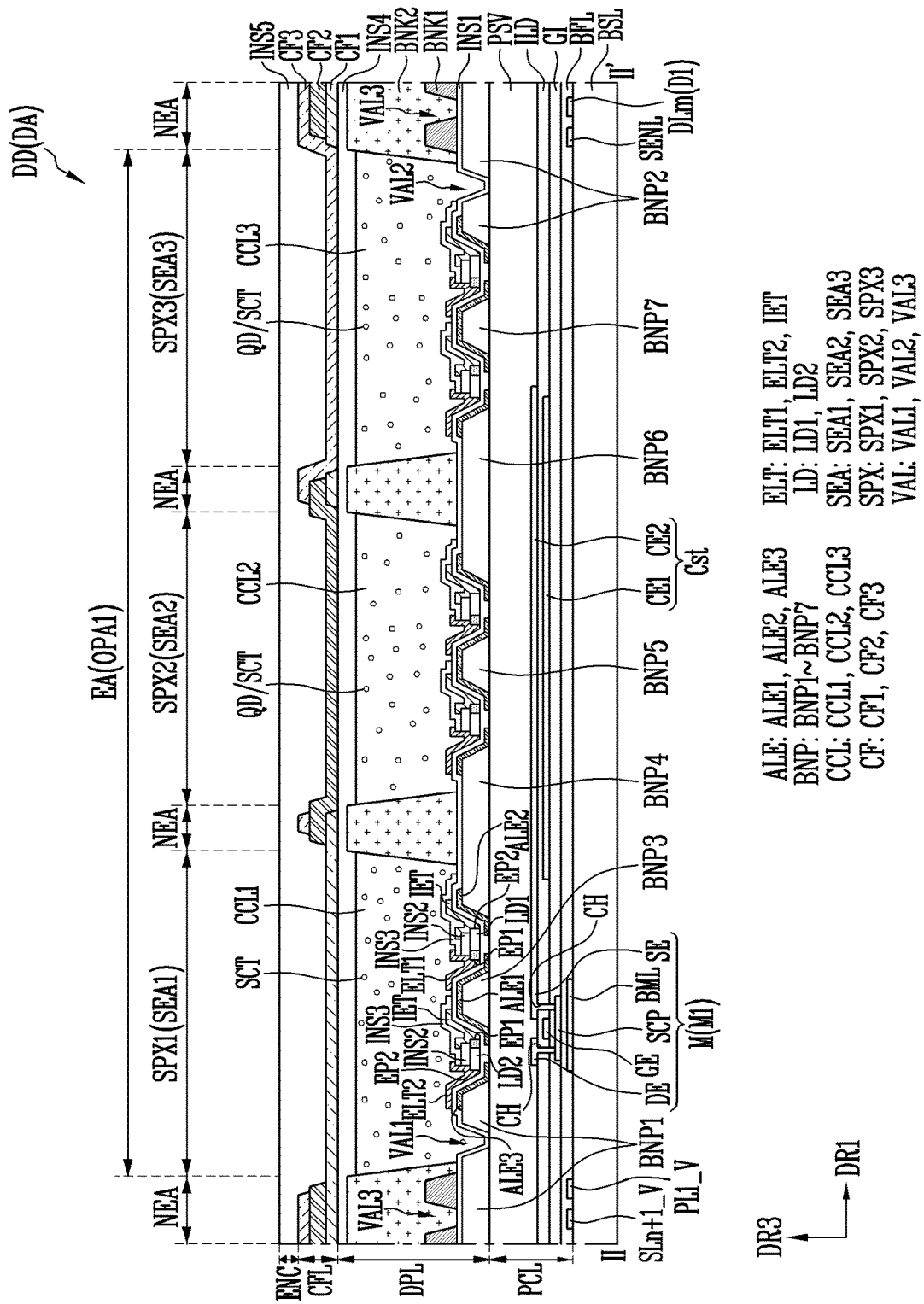
FIGS. 9 and 10 are schematic cross-sectional views illustrating the display device according to an embodiment.
Figure 10:
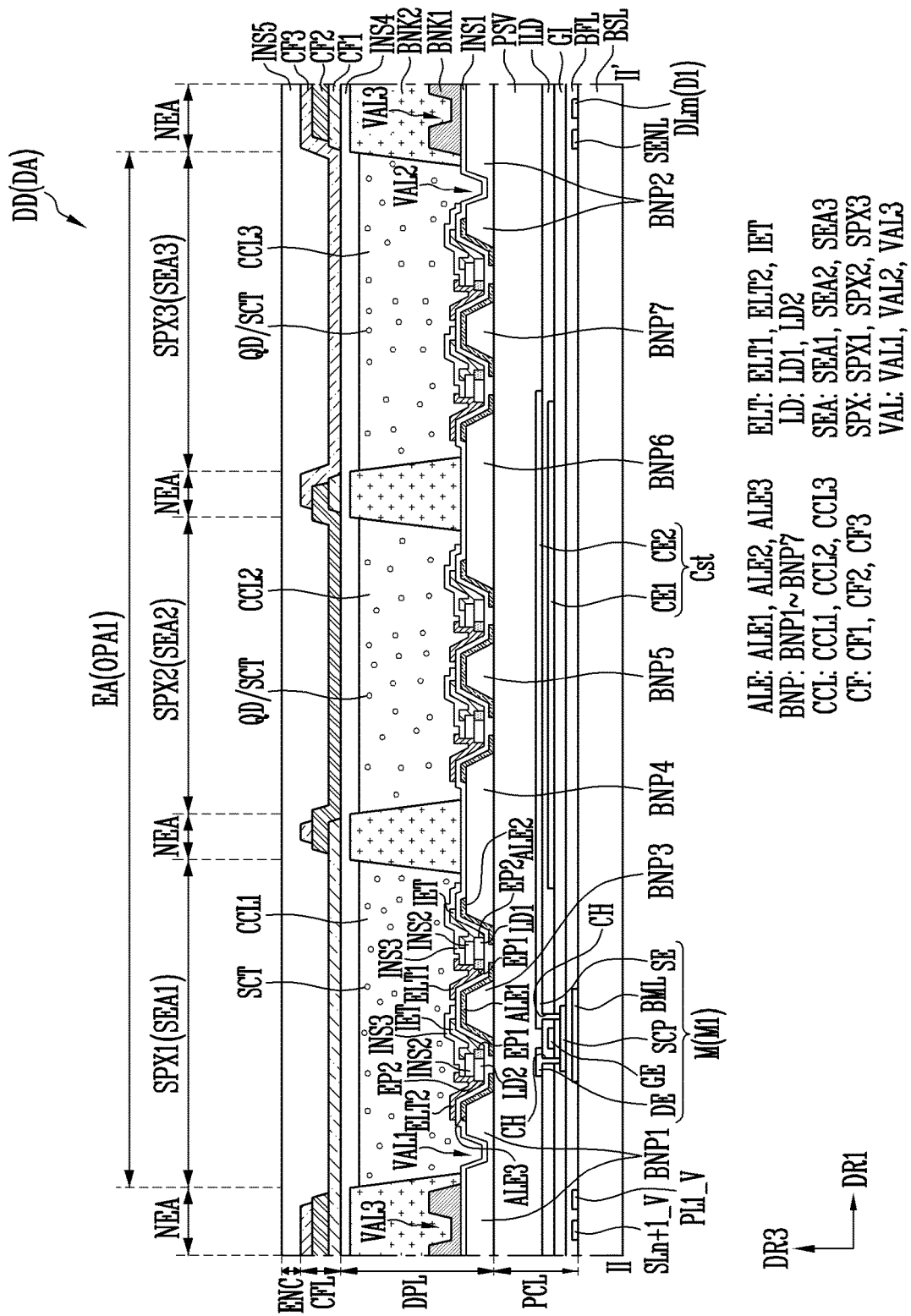

FIGS. 9 and 10 are cross-sectional views illustrating the display device DD according to an embodiment. For example, FIGS. 9 and 10 schematically show cross-sections of the display area DA corresponding to the line II-II' of FIG. 7 and the display device DD including the display area DA. FIGS. 9 and 10 show different embodiments with respect to the structure and/or size (for example, depth) of the valleys VAL.

In FIGS. 9 and 10, as an example of circuit elements that may be disposed in the pixel circuit layer PCL of the display area DA, a transistor M (for example, the first transistor including the bottom metal layer BML) and the capacitor Cst are shown. In FIGS. 9 and 10, as examples of other elements that may be disposed in the pixel circuit layer PCL of the display area DA, some of the lines (for example, the second sub-scan line SLn+1_V of the (n+1)th scan line SLn+1, the (1-2)th sub-power source line PL1_V, the sensing line SENL, and the first sub-data line D1) positioned around the pixel PXL are shown. Other circuit elements provided in each pixel circuit PXC, and various signal lines and/or power source lines may also be disposed in the pixel circuit layer PCL.

Referring to FIGS. 3 to 10, the display device DD may include the base layer BSL, the pixel circuit layer PCL, and the display element layer DPL. The pixel circuit layer PCL and the display element layer DPL may be disposed to overlap each other on the base layer BSL. For example, the pixel circuit layer PCL and the display element layer DPL may be sequentially disposed on a surface of the base layer BSL.

Also, the display device DD may further include a color filter layer CFL and/or an encapsulation layer ENC (or a protective layer) disposed on the display element layer DPL. In an embodiment, the color filter layer CFL and/or the encapsulation layer ENC may be directly formed on a surface of the base layer BSL on which the pixel circuit layer PCL and the display element layer DPL are formed, but the embodiments are not limited thereto.

The base layer BSL may be a rigid substrate, a flexible substrate, or a film, and the material or structure thereof is not particularly limited. For example, the base layer BSL may include at least one transparent or opaque insulating material, and may be a single-layer or multi-layer substrate or film.

The pixel circuit layer PCL may be provided on one surface of the base layer BSL. The pixel circuit layer PCL may include circuit elements constituting the pixel circuits PXC (for example, the first, second, and third pixel circuits PXC1, PXC2, and PXC3) of the sub-pixels SPX. For example, a plurality of circuit elements including first transistors of the first, second, and third pixel circuits PXC1, PXC2, and PXC3 may be formed in each pixel area PXA of the pixel circuit layer PCL. Each of the first transistors may be electrically connected to at least one electrode (for example, the first alignment electrode ALE1) constituting the light emitting unit EMU of each sub-pixel SPX through the first contact portion CNT1 of FIGS. 7 and 8.

Also, the pixel circuit layer PCL may include lines connected to the sub-pixels SPX. For example, the pixel circuit layer PCL may include the scan lines SL, the data lines DL, the sensing lines SENL, and the first and second power source lines PL1 and PL2 electrically connected to the pixel circuit PXC and/or the light emitting unit EMU of each of the sub-pixels SPX.

In an embodiment, the lines may be disposed around the emission area EA to avoid overlapping the emission area EA of each pixel PXL. For example, the lines may be disposed between the pixels PXL of the display area DA. Also, the lines may overlap the first bank BNK1. For example, the first bank BNK1 may be formed to cover upper portions of the lines formed in the pixel circuit layer PCL. Accordingly, by preventing or reducing the influence of the lines formed in the pixel circuit layer PCL when aligning the light emitting elements LD, alignment characteristics of the light emitting elements LD can be improved.

The pixel circuit layer PCL may include insulating layers. For example, the pixel circuit layer PCL may include a buffer layer BFL, a gate insulating layer GI, an interlayer insulating layer ILD, and/or a passivation layer PSV sequentially disposed on one surface of the base layer BSL.

The pixel circuit layer PCL may be disposed on the base layer BSL and may include a first conductive layer including bottom metal layers BML of the first transistors M1. For example, the first conductive layer may be disposed between the base layer BSL and the buffer layer BFL and may include the bottom metal layers BML of the first transistors included in the sub-pixels SPX. The bottom metal layers BML of the first transistors may overlap gate electrodes GE and semiconductor patterns SCP of the first transistors.

Also, the first conductive layer may further include lines. For example, the first conductive layer may include at least some of the lines extending in the second direction DR2 in the display area DA. For example, the first conductive layer may include second sub-scan lines (for example, second sub-scan lines SLn_V and SLn+1_V of the n-th and (n+1)th scan lines SLn and SLn+1 of FIG. 6), (1-2)th sub-power source lines PL1_V, (2-2)th sub-power source lines PL2_V, the sensing lines SENL, and the data lines DL.

The buffer layer BFL may be disposed on a surface of the base layer BSL including the first conductive layer. The buffer layer BFL may prevent impurities from diffusing into each circuit element.

A semiconductor layer may be disposed on the buffer layer BFL. The semiconductor layer may include semiconductor patterns SCP of the transistors M. Each semiconductor pattern SCP may include a channel region overlapping a gate electrode GE of a corresponding transistor M, and first and second conductive regions (for example, source and drain regions) disposed on both sides of the channel region.

The gate insulating layer GI may be disposed on the semiconductor layer. A second conductive layer may be disposed on the gate insulating layer GI.

The second conductive layer may include gate electrodes GE of the transistors M. The second conductive layer may further include an electrode of each of capacitors Cst (for example, a first electrode CE1 of each capacitor Cst) provided in the pixel circuits PXC. In an embodiment, a gate electrode GE of the first transistor of each sub-pixel SPX may be integrally or non-integrally formed with the first electrode CE1 of the capacitor Cst of the sub-pixel SPX. When at least one of the power source lines and/or the signal lines disposed in the display area DA is composed of multiple layers, the second conductive layer may further include at least one conductive pattern constituting the power source lines and/or the signal lines.

The interlayer insulating layer ILD may be disposed on the second conductive layer. A third conductive layer may be disposed on the interlayer insulating layer ILD.

The third conductive layer may include source electrodes SE and drain electrodes DE of the transistors M. Each source electrode SE may be connected to a region (for example, a source region) of the semiconductor pattern SCP included in the corresponding transistor M through at least one contact hole CH, and each drain electrode DE may be connected to another region (for example, a drain region) of the semiconductor pattern SCP included in the corresponding transistor M through at least one other contact hole CH.

The third conductive layer may further include one electrode of each of the capacitors Cst (for example, a second electrode CE2 of each capacitor Cst) and/or predetermined lines provided in the pixel circuits PXC. In an embodiment, the source electrode SE of the first transistor of each sub-pixel SPX may be formed integrally or non-integrally with the second electrode CE2 of the capacitor Cst of the sub-pixel SPX. Also, the third conductive layer may include at least some of the lines extending in the first direction DR1 in the display area DA. For example, the third conductive layer may include first sub-scan lines (for example, first sub-scan lines SLn_H and SLn+1_H of the n-th and (n+1)th scan lines SLn and SLn+1 and the first sub-scan line SLn+2_H of the (n+2)th scan line of FIG. 6), (1-1)th sub-power source lines PL1_H, and the (1-1)th sub-power source lines PL2_H. When at least one power source line and/or signal line disposed in the display area DA is composed of multiple layers, the third conductive layer may further include at least one conductive pattern constituting the at least one power source line and/or signal line.

Each of conductive patterns, electrodes, and/or lines constituting the first to third conductive layers may have conductivity by including at least one conductive material, and the conductive material is not particularly limited. For example, each of the conductive patterns, electrodes and/or lines constituting the first to third conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may also include various types of other conductive materials.

The passivation layer PSV may be disposed on the third conductive layer. Each of the buffer layer BFL, the gate insulating layer GI, the interlayer insulating layer ILD, and the passivation layer PSV may be composed of a single layer or multiple layers, and may include at least one inorganic insulating material and/or organic insulating material. For example, each of the buffer layer BFL, the gate insulating layer GI, the interlayer insulating layer ILD, and the passivation layer PSV may include various types of organic/inorganic insulating materials including silicon nitride ($SiN_x$), silicon oxide ($SiO_x$), or silicon oxynitride ($SiO_xN_y$). In an embodiment, the passivation layer PSV may include an organic insulating layer and may planarize the surface of the pixel circuit layer PCL.

The display element layer DPL may be disposed on the passivation layer PSV.

The display element layer DPL may include the light emitting units EMU of the sub-pixels SPX. For example, the display element layer DPL may include the alignment electrodes ALE, the light emitting elements LD, and the pixel electrodes ELT included in the light emitting unit EMU of each sub-pixel SPX.

The display element layer DPL may further include insulating patterns and/or insulating layers sequentially disposed on a surface of the base layer BSL on which the pixel circuit layer PCL is formed. For example, the display element layer DPL may include the bank patterns BNP, a first insulating layer INS1, the first bank BNK1, a second insulating layer INS2, a third insulating layer INS3, and a fourth insulating layer INS4. The display element layer DPL may further include a second bank BNK2 and a light conversion layer CCL.

The bank patterns BNP may be provided and/or formed on the passivation layer PSV. Each of the bank patterns BNP may overlap at least one alignment electrode ALE, and may be sequentially arranged in the first direction DR1 in each emission area EA. The first bank pattern BNP1 and the second bank pattern BNP2 positioned in the first edge area and the second edge area of the emission area EA in the first direction DR1 may include the first valley VAL1 and the second valley VAL2, respectively.

In an embodiment, the first valley VAL1 may be formed as an etched opening that has the same depth as the entire thickness (or height) of the first bank pattern BNP1 as illustrated in FIG. 9. In other embodiments, the first valley VAL1 may be formed as an etched groove that has a depth that is equal to a portion of the thickness (or height) of the first bank pattern BNP1 as illustrated in FIG. 10.

In an embodiment, when the first bank pattern BNP1 includes multiple first valleys VAL1, the first valleys VAL1 may have the same shape, size and/or structure, or may have different shapes, sizes, and/or structures. For example, the size, shape, and/or structure of each of the first valleys VAL1 may vary according to embodiments.

In an embodiment, the second valley VAL2 may be formed as an etched opening etched that has the substantially the same depth as the entire thickness (or height) of the second bank pattern BNP2 as illustrated in FIG. 9. In other embodiment, the second valley VAL2 may be formed as an etched groove that has a depth that is equal to a portion of the thickness (or height) of the second bank pattern BNP2 as illustrated in FIG. 10.

In an embodiment, in case that the second bank pattern BNP2 includes multiple second valleys VAL2, the second valleys VAL2 may have the same shape, size and/or structure, or may have different shapes, sizes, and/or structures. For example, the size, shape, and/or structure of each of the second valleys VAL2 may vary according to embodiments.

A portion of each of the alignment electrodes ALE may protrude upward (for example, the third direction DR3) from the periphery of the light emitting elements LD by the bank patterns BNP. A reflective protrusion pattern may be formed around the light emitting elements LD by the bank patterns BNP and the alignment electrodes ALE. Accordingly, light efficiency of the sub-pixels SPX and the pixel PXL including the sub-pixels SPX may be increased.

The bank patterns BNP may include an inorganic insulating layer made of an inorganic material or an organic insulating layer made of an organic material. Also, the bank patterns BNP may be formed of a single layer or multiple layers. The alignment electrodes ALE of the light emitting units EMU (for example, the first, second and third alignment electrodes ALE1, ALE2, and ALE3 constituting each light emitting unit EMU) may be formed on the bank patterns BNP.

The alignment electrodes ALE may include at least one conductive material. For example, the alignment electrodes ALE may include at least one of various metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or an alloy thereof, a conductive oxide such as ITO (Indium Tin Oxide), IZO (Indium Zinc Oxide), ITZO (Indium Tin Zinc Oxide), ZnO (Zinc Oxide), AZO (Aluminum doped Zinc Oxide), GZO (Gallium doped Zinc Oxide), ZTO (Zinc Tin Oxide), GTO (Gallium Tin Oxide), and FTO (Fluorine doped Tin Oxide), and a conductive polymer such as PEDOT, but the embodiments are not limited thereto. For example, the alignment electrodes ALE may include other conductive materials such as carbon nanotubes or graphene. The alignment electrodes ALE may have conductivity by including at least one of various conductive materials. Also, the alignment electrodes ALE may include the same or different conductive materials.

Each of the alignment electrodes ALE may be composed of a single layer or multiple layers. For example, each alignment electrode ALE may include a reflective electrode layer including a reflective conductive material (for example, metal). Also, each alignment electrode ALE may further include at least one of a transparent electrode layer disposed above and/or below the reflective electrode layer, and a conductive capping layer covering an upper portion of the reflective electrode layer and/or the transparent electrode layer.

The first insulating layer INS1 may be disposed on the alignment electrodes ALE. In an embodiment, the first insulating layer INS1 may include multiple contact portions (for example, the fourth and fifth contact portions CNT4 and CNT5 of FIG. 7) for connecting the first and third alignment electrodes ALE1 and ALE3 to the first and second pixel electrodes ELT1 and ELT2, respectively. In another embodiment, the first insulating layer INS1 may be formed on an entire surface of the display area DA in which the alignment electrodes ALE are formed, and may include openings exposing a portion of each of the first and third alignment electrodes ALE1 and ALE3. The first and third alignment electrodes ALE1 and ALE3 may be connected to the first and second pixel electrodes ELT1 and ELT2, respectively, in an area in which the contact portions are formed in the first insulating layer INS1 (or an area in which the first insulating layer INS1 is opened). In an embodiment, the first insulating layer INS1 may be locally disposed only under the area in which the light emitting elements LD are arranged.

The first insulating layer INS1 may be composed of a single layer or multiple layers, and may include at least one inorganic insulating material and/or organic insulating material. In an embodiment, the first insulating layer INS1 may include at least one kind of inorganic insulating material including silicon nitride ($SiN_x$), silicon oxide ($SiO_x$), or silicon oxynitride ($SiO_xN_y$).

Since the alignment electrodes ALE are covered by the first insulating layer INS1, damage to the alignment electrodes ALE can be prevented in subsequent processes. The electrical stability of the alignment electrodes ALE may also be ensured.

The first bank BNK1 may be disposed on the display area DA in which the alignment electrodes ALE and the first insulating layer INS1 are formed. The first bank BNK1 may have the first opening OPA1 integrally opened to correspond to the emission area EA of each pixel PXL including each of the sub-emission areas EA, and may be formed to surround the emission area EA of each pixel PXL. Accordingly, each emission area EA to which the light emitting elements LD are to be supplied may be defined (or partitioned).

The first bank BNK1 may include at least one third valley VAL3. In an embodiment, the third valley VAL3 may be formed as an etched opening having a depth that is the substantially the same as the entire thickness (or height) of the first bank BNK1 as illustrated in the embodiment of FIG. 9. In other embodiment, the third valley VAL3 may be formed as an etched groove having a depth equal to a portion of the thickness (or height) of the first bank BNK1 as illustrated in FIG. 10.

In an embodiment, when the first bank BNK1 includes multiple third valleys VAL3, the third valleys VAL3 may have the same shape, size and/or structure, or have different shapes, sizes, and/or structures. For example, the size, shape, and/or structure of each of the third valleys VAL3 may vary according to embodiments.

The light emitting elements LD may be supplied to each emission area EA surrounded by the first bank BNK1. The light emitting elements LD may be aligned between the alignment electrodes ALE by the alignment signals applied to the alignment electrodes ALE (or alignment lines). For example, the light emitting elements LD supplied to each emission area EA may be arranged between the first, second, and third alignment electrodes ALE1, ALE2, and ALE3 of the first sub-emission area SEA1, between the first, second, and third alignment electrodes ALE1, ALE2, and ALE3 of the second sub-emission area SEA2, and between the first, second, and third alignment electrodes ALE1, ALE2, and ALE3 of the third sub-emission area SEA3.

In an embodiment, the light emitting elements LD arranged in the sub-emission areas SEA may be light emitting elements of the same color. For example, all of the light emitting elements LD arranged in the first, second, and third sub-emission areas SEA1, SEA2, and SEA3 may be blue light emitting element emitting blue light.

The second insulating layer INS2 (also referred to as an insulation pattern) may be disposed on a portion of the light emitting elements LD. For example, the second insulating layer INS2 may be locally disposed on a portion including a central portion of the light emitting elements LD to expose the first and second ends EP1 and EP2 of the light emitting elements LD aligned between a pair of alignment electrodes ALE. When the second insulating layer INS2 is formed on the light emitting elements LD, the light emitting elements LD may be stably fixed, and the pixel electrodes ELT disposed on the first and second ends EP1 of the light emitting elements LD may be stably separated from each other.

The second insulating layer INS2 may be composed of a single layer or multiple layers, and may include at least one inorganic insulating material and/or organic insulating material. For example, the second insulating layer INS2 may include various types of organic/inorganic insulating materials including silicon nitride ($SiN_x$), silicon oxide ($SiO_x$), silicon oxynitride ($SiO_xN_y$), aluminum oxide ($Al_xO_y$), photoresist (PR), and the like.

The pixel electrodes ELT (for example, the first pixel electrode ELT1, the second pixel electrode ELT2, and the intermediate electrode IET) may be formed on both ends of the light emitting elements LD, for example, the first and second ends EP1 and EP2. For example, the first pixel electrode ELT1 may be disposed on the first end EP1 of the first light emitting element LD1, and the intermediate electrode IET may be disposed on the second end EP2 of the first light emitting element LD1. The intermediate electrode IET may be disposed on the first end EP1 of the second light emitting element LD2, and the second pixel electrode ELT2 may be disposed on the second end EP2 of the second light emitting element LD2.

The pixel electrodes ELT may be formed on the same or different layers. For example, the positions and/or the formation order of the first pixel electrode ELT1, the second pixel electrode ELT2, and the intermediate electrode IET may vary according to embodiments.

In the embodiments of FIGS. 9 and 10, each intermediate electrode IET may be formed first on the second insulating layer INS2. The intermediate electrode IET may be connected between the first light emitting element LD1 and the second light emitting element LD2 by directly contacting the second end EP2 of the first light emitting element LD1 and the first end EP1 of the second light emitting element LD2, but the embodiments are not limited thereto. Thereafter, the third insulating layer INS3 may be formed in each emission area EA to cover the intermediate electrode IET, and the first and second pixel electrodes ELT1 and ELT2 may be formed in each sub-emission area SEA in which the third insulating layer INS3 is formed. The first and second pixel electrodes ELT1 and ELT2 may be formed simultaneously or sequentially. In an embodiment, the first pixel electrode ELT1 may be connected to the first end EP1 of the first light emitting element LD1 by directly contacting the first end EP1 of the first light emitting element LD1, and the second pixel electrode ELT2 may be connected to the second end EP2 of the second light emitting element LD2 by directly contacting the second end EP2 of the second light emitting element LD2.

According to an embodiment, the first and second pixel electrodes ELT1 and ELT2 may be formed first, and at least one insulating layer may be formed to cover the first and second pixel electrodes ELT1 and ELT2. Thereafter, each intermediate electrode IET may be formed on the insulating layer. In other embodiments, the first and second pixel electrodes ELT1 and ELT2 and the intermediate electrode IET of each sub-pixel SPX may be simultaneously formed on the same layer. The third insulating layer INS3 may be omitted.

As in FIG. 4, when each sub-pixel SPX includes light emitting units EMU having a parallel structure, the sub-pixel SPX may not include the intermediate electrode IET. The first pixel electrode ELT1 may be disposed on the first ends EP1 of the light emitting elements LD, and the second pixel electrode ELT2 may be disposed on the second ends EP2 of the light emitting elements LD.

The pixel electrodes ELT may include at least one conductive material. In an embodiment, the pixel electrodes ELT may include a transparent conductive material so that light emitted from the light emitting elements LD may be transmitted.

In an embodiment, the display device DD may include light conversion layers CCL disposed in the sub-emission areas SEA to be positioned on top of the light emitting elements LD. The light conversion layers CCL may include at least one of wavelength conversion particles (for example, quantum dots QD) and/or light scattering particles SCT provided in each sub-emission area SEA.

The display device DD may include openings corresponding to the sub-emission areas SEA and may further include the second bank BNK2 surrounding the sub-emission areas SEA. The second bank BNK2 may define (or partition) each sub-emission area EA in which each light conversion layer CCL is to be formed.

The second bank BNK2 may include a light blocking and/or reflective material including a black matrix material or the like. Accordingly, optical interference between the sub-pixels SPX can be prevented. The second bank BNK2 and the first bank BNK1 may include the same material or may include different materials. Since the second bank BNK2 is disposed around the sub-emission areas SEA, the remaining areas (for example, areas between the sub-emission areas SEA) except for the sub-emission areas SEA in each emission area EA may be the non-emission area NEA.

The light conversion layer CCL may include wavelength conversion particles (or color conversion particles) that convert the wavelength and/or color of the light emitted from the light emitting elements LD, and/or the light scattering particles SCT that scatter the light emitted from the light emitting elements LD to increase light output efficiency. For example, in each sub-emission area SEA, each light conversion layer CCL may include wavelength conversion particles including at least one type of quantum dots QD (for example, red, green and/or blue quantum dots) and/or light scattering particles SCT.

For example, a first light conversion layer CCL1, a second light conversion layer CCL2, and a third light conversion layer CCL3 may be disposed in the first sub-emission area SEA1, the second sub-emission area SEA2, and the third sub-emission area SEA3, respectively. The color filters CF corresponding to the color of each sub-pixel SPX may be disposed in the first sub-emission area SEA1, the second sub-emission area SEA2, and the third sub-emission area SEA3.

In an embodiment, in the first sub-emission area SEA1, light emitting elements LD that emit light of a first color (for example, blue), a first light conversion layer CCL1 disposed on the light emitting elements LD and including at least light scattering particles SCT may be disposed. A first color filter CF1 (for example, a blue color filter) may be disposed on the first light conversion layer CCL1 and selectively transmit the light of the first color. Accordingly, the first sub-pixel SPX1 may emit the first color light.

In an embodiment, in the second sub-emission area SEA2, light emitting elements LD that emit light of the first color, a second light conversion layer CCL2 disposed on the light emitting elements LD and including wavelength conversion particles (for example, green quantum dots) that convert the light of the first color into light of a second color (for example, green) and light scattering particles SCT may be disposed. A second color filter CF2 (for example, a green color filter) may be disposed on the second light conversion layer CCL2 and selectively transmit the light of the second color. Accordingly, the second sub-pixel SPX2 may emit the second color light.

In an embodiment, in the third sub-emission area SEA3, light emitting elements LD that emit light of the first color, a third light conversion layer CCL3 disposed on the light emitting elements LD and including wavelength conversion particles (for example, red quantum dots) that convert the light of the first color into light of a third color (for example, red) and light scattering particles SCT may be disposed. A third color filter CF3 (for example, a red color filter) may be disposed on the third light conversion layer CCL3 and selectively transmit the light of the third color. Accordingly, the third sub-pixel SPX3 may emit the third color light.

The fourth insulating layer INS4 may be provided between the light conversion layers CCL and the color filters CF. For example, the fourth insulating layer INS4 may be disposed on the uppermost layer of the display element layer DPL to cover the light conversion layers CCL and the second bank BNK2.

In an embodiment, the fourth insulating layer INS4 may include an organic and/or inorganic insulating layer, and may substantially planarize the surface of the display element layer DPL. The fourth insulating layer INS4 may protect the light emitting units EMU and/or the light conversion layers CCL.

The color filter layer CFL may be disposed on the fourth insulating layer INS4.

The color filter layer CFL may include the color filters CF corresponding to the colors of the sub-pixels SPX. For example, the color filter layer CFL may include the first color filter CF1 disposed on the first light emitting unit EMU1 of the first sub-pixel SPX1, the second color filter CF2 disposed on the second light emitting unit EMU2 of the second sub-pixel SPX2, and the third color filter CF3 disposed on the third light emitting unit EMU3 of the third sub-pixel SPX3.

In an embodiment, the first, second, and third color filters CF1, CF2, and CF3 may be disposed to overlap each other in the non-emission area NEA between the sub-emission areas SEA to block the optical interference between the sub-pixels SPX. In other embodiments, the first, second, and third color filters CF1, CF2, and CF3 may be formed of individual patterns arranged separately from each other on the first, second, and third sub-emission areas SEA1, SEA2, and SEA3, respectively. A separate light blocking pattern and the like may be disposed between the first, second, and third color filters CF1, CF2, and CF3.

The encapsulation layer ENC may be disposed on the color filter layer CFL. The encapsulation layer ENC may include at least one organic and/or inorganic insulating layer including a fifth insulating layer INS5. The fifth insulating layer INS5 may be formed on the entire surface of the display area DA to cover the pixel circuit layer PCL, the display element layer DPL, and/or the color filter layer CFL.

The fifth insulating layer INS5 may be composed of a single layer or multiple layers, and may include at least one inorganic insulating material and/or organic insulating material. For example, the fifth insulating layer INS5 may include various types of organic/inorganic insulating materials including silicon nitride ($SiN_x$), silicon oxide ($SiO_x$), silicon oxynitride ($SiO_xN_y$), or aluminum oxide ($Al_xO_y$).

In an embodiment, the fifth insulating layer INS5 may be formed of multiple layers. For example, the fifth insulating layer INS5 may include at least two inorganic insulating layers and at least one organic insulating layer interposed between the at least two inorganic insulating layers. However, the material and/or the structure of the fifth insulating layer INS5 may vary. Also, according to an embodiment, at least one overcoat layer, a filler layer, and/or an upper substrate may be further disposed on the fifth insulating layer INS5.

Figure 11:
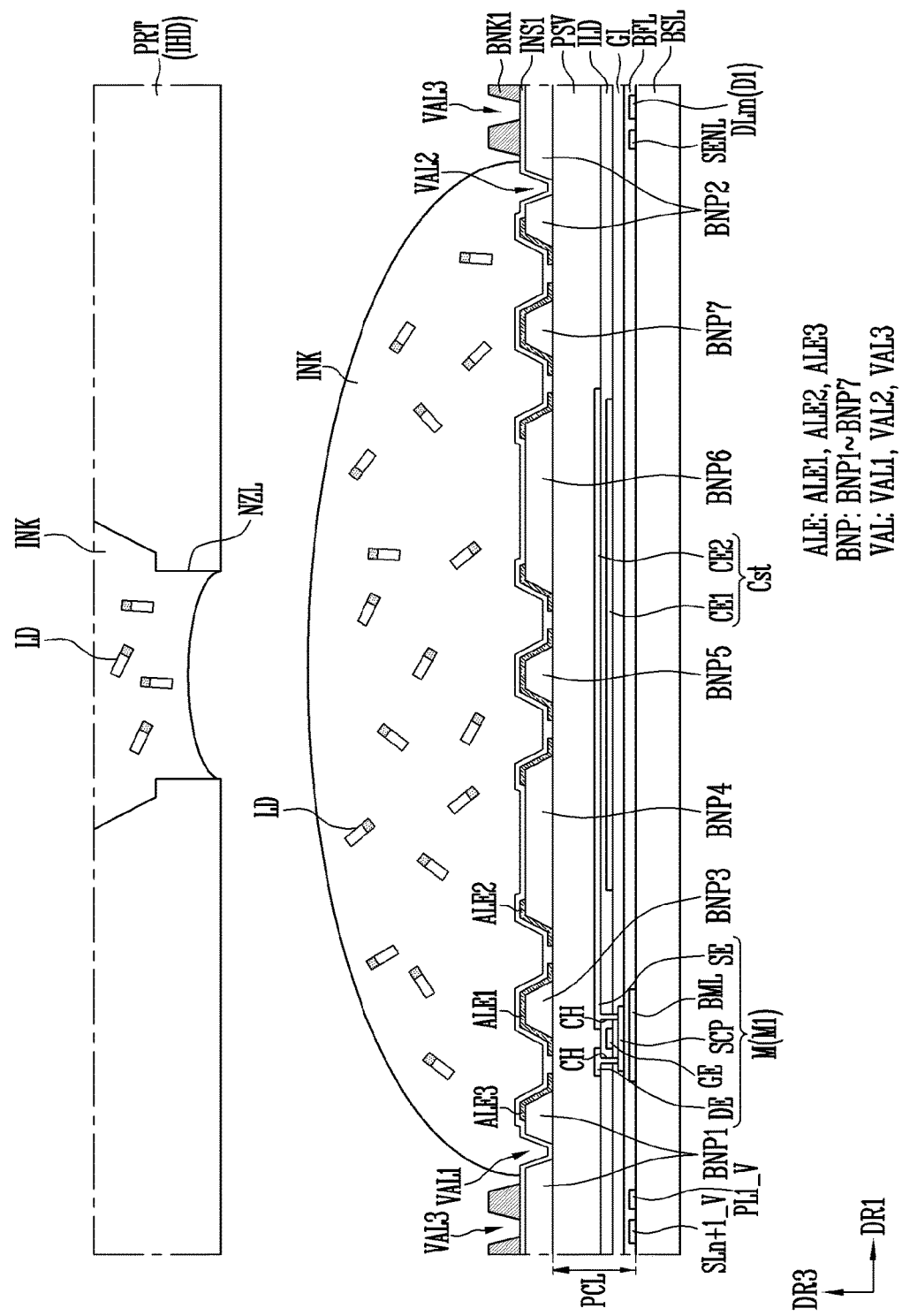
FIGS. 11 and 12 are schematic cross-sectional views illustrating a method of supplying and aligning light emitting elements according to an embodiment.
Figure 12:
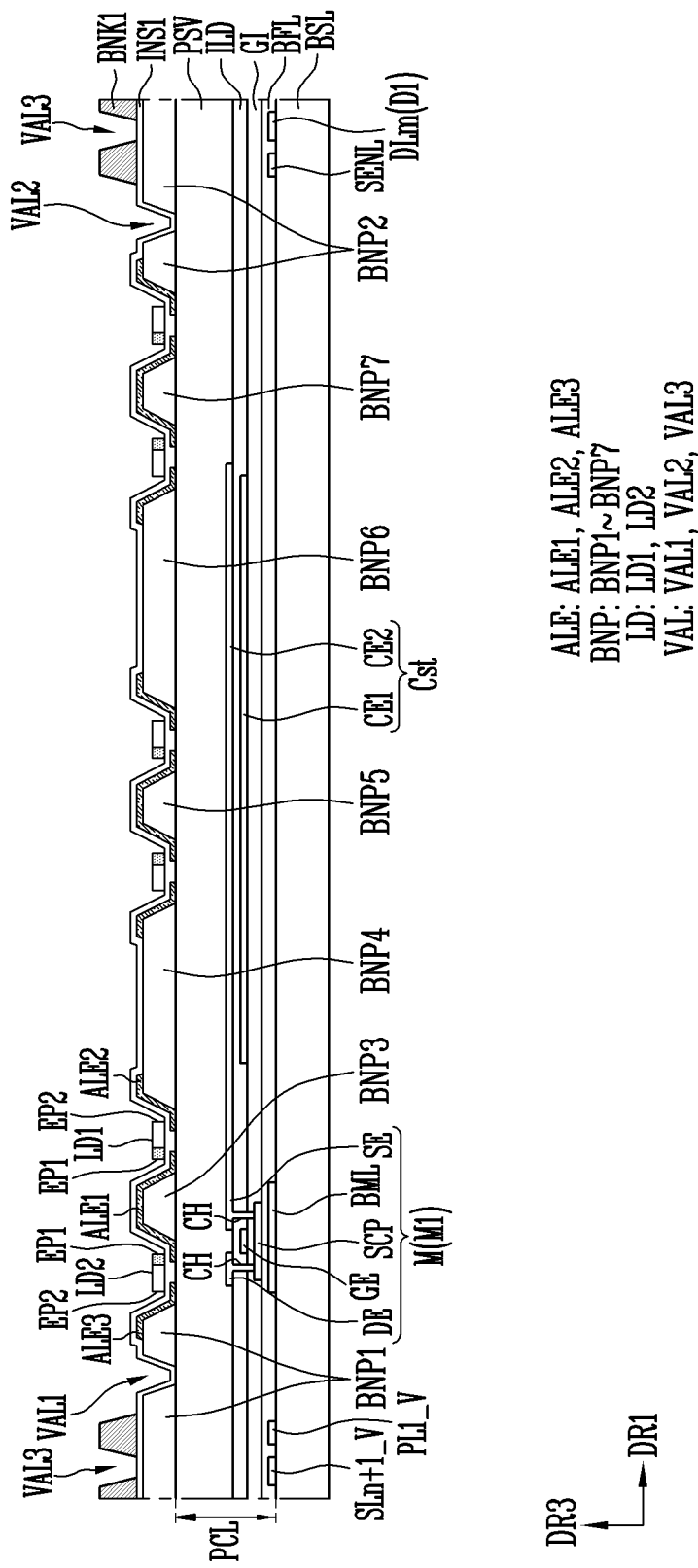

FIGS. 11 and 12 are cross-sectional views illustrating a method of supplying and aligning light emitting elements LD according to an embodiment. For example, FIGS. 11 and 12 are schematic cross-sectional views sequentially illustrating a method of supplying the light emitting elements LD to the emission area EA of FIG. 9 and aligning the light emitting elements LD between the alignment electrodes LD.

Referring to FIG. 11, each of the bank patterns BNP, the alignment electrodes ALE, and the first insulating layer INS1 may be formed, and light emitting element ink INK in which the light emitting elements LD are mixed may be supplied to each emission area EA surrounded by the first bank BNK1. For example, the display device DD in which the bank patterns BNP, the alignment electrodes ALE, the first insulating layer INS1, and the first bank BNK1 are formed (for example, the display device DD being manufactured) may be disposed under an inkjet printing apparatus PRT, and an inkjet head IHD may be disposed above the emission area EA of each pixel PXL as the inkjet head IHD of the inkjet printing apparatus PRT moves in the first direction DR1 and the like. When a nozzle NZL of the inkjet head IHD is arranged in the center of the emission area EA, the light emitting elements LD can be supplied to the emission area EA by applying the light emitting element ink INK mixed with light emitting elements LD to the emission area EA.

Referring to FIGS. 11 and 12, the light emitting elements LD may be aligned between the alignment electrodes ALE by applying the alignment signals to the alignment electrodes ALE while the light emitting elements LD are supplied or after they are supplied. After the light emitting elements LD are aligned, the solvent mixed with the light emitting element ink INK may be removed through a drying process or the like.

In an embodiment, at least one valley VAL may be formed in the first bank pattern BNP1, the second bank pattern BNP2, and/or the first bank BNK1. Accordingly, the volume amount of the light emitting element ink INK that can be accommodated in each emission area EA can be increased, and the problem that the light emitting element ink INK overflows into the emission area EA of the peripheral pixel PXL can be reliably prevented. Accordingly, the amount of the light emitting element ink INK that can be applied at one time can be increased, so that a larger number of the light emitting elements LD can be supplied to each emission area EA at one time. Accordingly, the manufacturing efficiency of the pixels PXL and the display device DD including the pixels PXL can be improved.

In the display device including the pixels, and in the pixels, according to the embodiments, the first bank may be formed to integrally surround the emission area including the sub-emission areas of each pixel. Accordingly, the volume amount of the light emitting element ink (or the light emitting element mixture) that can be accommodated in each emission area may be increased.

In the pixel and the display device including the pixels, according to the embodiments, the first and second valleys may be formed in the first and second bank patterns positioned in the first and second edge areas of each emission area. Accordingly, the volume amount of the light emitting element ink that can be accommodated in each emission area may be further increased.

In an embodiment, the first bank may include the third valley surrounding each emission area. The light emitting element ink may be prevented from overflowing.

According to the above-described embodiments, the process time required for supplying and aligning the light emitting elements to each emission area may be reduced, and the manufacturing efficiency of the pixels and the display device including the pixels may be improved.

The effects according to the embodiments are not limited by the contents described above, and more various effects are included in the disclosure.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
    a pixel including:
        sub-pixels; and
        an emission area including sub-emission areas corresponding to the sub-pixels; and
    a bank surrounding the emission area, wherein
    the pixel includes:
        electrodes disposed in each of the sub-emission areas;
        at least one light emitting element disposed in each of the sub-emission areas; and
        bank patterns disposed under the electrodes, the bank patterns overlapping a portion of the electrodes, the bank patterns include:
            a first bank pattern including a first valley, the first bank pattern being disposed in a first edge area of the emission area in a first direction; and
            a second bank pattern including a second valley, the second bank pattern being disposed in a second edge area of the emission area in the first direction.

2. The display device of claim 1, wherein the first valley and the second valley each have a slit shape that extends in a second direction intersecting the first direction.

3. The display device of claim 1, wherein the bank includes:
    a first opening corresponding to the emission area of the pixel; and
    a third valley surrounding the first opening.

4. The display device of claim 3, wherein
    the pixel includes a separation area spaced apart from the emission area,
    an end of at least one of the electrodes is disposed in the separation area, and
    the bank further includes a second opening corresponding to the separation area.

5. The display device of claim 4, wherein the third valley surrounds the first opening and the second opening.

6. The display device of claim 3, wherein the third valley has a closed shape in a plan view.

7. The display device of claim 1, wherein each of the sub-pixels includes:
    a pixel circuit including a circuit element electrically connected to at least one of the electrodes; and
    a light emitting unit including the electrodes and the at least one light emitting element.

8. The display device of claim 7, further comprising:
    a circuit element layer including lines electrically connected to the pixel circuit and the light emitting unit; and
    a display element layer overlapping the circuit element layer and including the light emitting unit.

9. The display device of claim 8, wherein the lines of the circuit element layer are disposed around the emission area and do not overlap the emission area.

10. The display device of claim 8, wherein the bank overlaps the lines of the circuit element layer.

11. The display device of claim 1, wherein
    the pixel further includes a light conversion layer disposed in at least one of the sub-emission areas and overlapping the at least one light emitting element, and
    the light conversion layer includes at least one of wavelength conversion particles and light scattering particles.

12. The display device of claim 11, wherein
    the at least one light emitting element includes at least one color light emitting element electrically connected to the electrodes, and
    the light conversion layer disposed in at least one of the sub-emission areas includes quantum dots that convert a first color light emitted from the at least one color light emitting element into a second color light.

13. A pixel comprising:
    an emission area including sub-emission areas;
    electrodes disposed in each of the sub-emission areas;
    at least one light emitting element disposed in each of the sub-emission areas;
    bank patterns disposed under the electrodes, the bank patterns overlapping a portion of the electrodes; and
    a bank including a first opening corresponding to the emission area, the bank surrounding the emission area,
    wherein the bank patterns include:
        a first bank pattern including a first valley, the first bank pattern being disposed in a first edge area of the emission area in a first direction; and
        a second bank pattern including a second valley, the second bank pattern being disposed in a second edge area of the emission area in the first direction.

14. The pixel of claim 13, wherein the first valley and the second valley each have a slit shape that extends in a second direction intersecting the first direction.

15. The pixel of claim 13, wherein the bank includes a third valley that surrounds the first opening.

16. The pixel of claim 15, further comprising:
    a separation area spaced apart from the emission area, wherein
    an end of at least one of the electrodes is disposed in the separation area, and the bank further includes a second opening corresponding to the separation area.

17. The pixel of claim 16, wherein the third valley surrounds the first opening and the second opening.

18. The pixel of claim 15, wherein the third valley has a closed shape in a plan view.

19. The pixel of claim 13, further comprising:
a light conversion layer disposed in each of the sub-emission areas and overlapping the at least one light emitting element, wherein
the light conversion layer includes at least one of wavelength conversion particles and light scattering particles.

20. The pixel of claim 19, wherein
the at least one light emitting element includes at least one color light emitting element electrically connected to the electrodes, and
the light conversion layer disposed in at least one of the sub-emission areas includes quantum dots that convert a first color light emitted from the at least one color light emitting element into a second color light.

\* \* \* \* \*